(12) United States Patent
Shinokawa et al.

(10) Patent No.: US 12,408,512 B2
(45) Date of Patent: Sep. 2, 2025

(54) ORGANIC EL DISPLAY PANEL AND METHOD FOR MANUFACTURING ORGANIC EL DISPLAY PANEL

(71) Applicant: JOLED INC., Tokyo (JP)

(72) Inventors: Yasuharu Shinokawa, Tokyo (JP); Kazuhiro Umezu, Tokyo (JP); Daisuke Ishikawa, Tokyo (JP); Yasuhiro Kawakatsu, Tokyo (JP)

(73) Assignee: JOLED INC., Tokyo (JP)

( * ) Notice: Subject to any disclaimer, the term of this patent is extended or adjusted under 35 U.S.C. 154(b) by 1025 days.

(21) Appl. No.: 17/310,514

(22) PCT Filed: Feb. 6, 2020

(86) PCT No.: PCT/JP2020/004675
§ 371 (c)(1),
(2) Date: Apr. 4, 2022

(87) PCT Pub. No.: WO2020/162571
PCT Pub. Date: Aug. 13, 2020

(65) Prior Publication Data
US 2022/0254846 A1    Aug. 11, 2022

(30) Foreign Application Priority Data
Feb. 8, 2019   (JP) ................................ 2019-021506

(51) Int. Cl.
*H10K 59/122*   (2023.01)
*H10K 59/12*    (2023.01)
(Continued)

(52) U.S. Cl.
CPC ........... *H10K 59/122* (2023.02); *H10K 71/00* (2023.02); *H10K 59/1201* (2023.02); *H10K 71/441* (2023.02); *H10K 71/861* (2023.02)

(58) Field of Classification Search
CPC ...... H10K 71/861; H10K 59/10; H10K 59/12; H10K 59/122; H10K 59/173;
(Continued)

(56) References Cited

U.S. PATENT DOCUMENTS

2017/0012246 A1   1/2017 Onimaru et al.
2017/0040393 A1*  2/2017 Onimaru ................ H10K 50/11
(Continued)

FOREIGN PATENT DOCUMENTS

JP   2007264186 A   10/2007
JP   2009104030 A    5/2009
(Continued)

OTHER PUBLICATIONS

International Search Report in PCT/JP2020/004675 dated Apr. 7, 2020.

*Primary Examiner* — Julio J Maldonado
*Assistant Examiner* — Stanetta D Isaac
(74) *Attorney, Agent, or Firm* — CHIP LAW GROUP

(57) ABSTRACT

An organic electro luminescence display panel includes pixel electrodes, a plurality of elongated column banks, a missing portion at which part of the elongated column banks does not exist, a pair of repair banks formed, above the pixel electrodes, in each of two gaps between a column bank that has the missing portion and column banks adjacent on opposite sides in a row direction of the column bank, a light emitting layer and a common electrode provided above the light emitting layer. The repair banks include a pair of repair row banks formed at positions spaced by a predetermined distance or more in a column direction above the pixel electrodes that exist in the two gaps and whose positions in the column direction are same, at least at part thereof, as that of the missing portion.

10 Claims, 18 Drawing Sheets

(51) Int. Cl.
*H10K 71/00* (2023.01)
*H10K 71/40* (2023.01)

(58) Field of Classification Search
CPC .... H10K 59/171; H10K 59/121; H10K 59/80; H10K 59/87; H10K 59/1201; H10K 71/70; H10H 29/37; H10H 29/80; H01L 22/10; H01L 22/12; H01L 22/20; H01L 22/22

See application file for complete search history.

(56) References Cited

U.S. PATENT DOCUMENTS

| | | |
|---|---|---|
| 2017/0077460 A1 | 3/2017 | Hayashida et al. |
| 2017/0170244 A1 | 6/2017 | Kobayashi et al. |
| 2017/0301889 A1 | 10/2017 | Hayashida et al. |

FOREIGN PATENT DOCUMENTS

| | | | |
|---|---|---|---|
| JP | 2010267576 A | 11/2010 | |
| JP | 2016071992 A | 5/2016 | |
| JP | 2017033813 A | 2/2017 | |
| JP | 2018101558 A | 6/2018 | |
| WO | 2015118882 A1 | 8/2015 | |
| WO | 2015118883 A1 | 8/2015 | |
| WO | 2015133090 A1 | 9/2015 | |
| WO | 2016047021 A1 | 3/2016 | |

\* cited by examiner

REPAIR OF BANK

BAKING

INK APPLICATION

DRYING

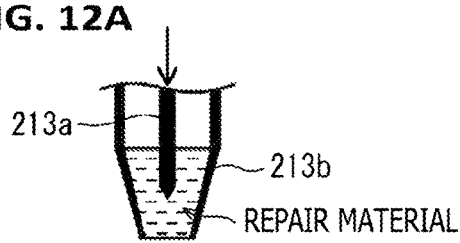
FIG. 12A
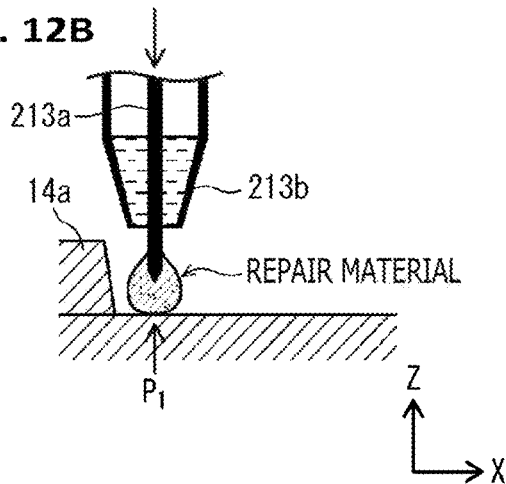
FIG. 12B
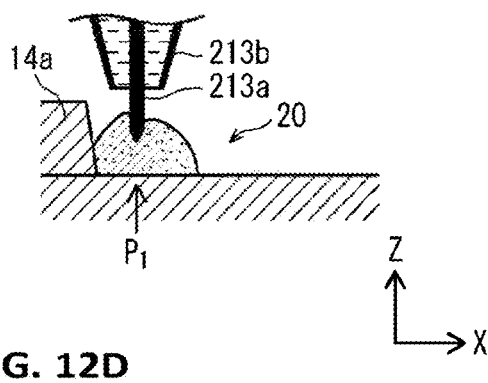
FIG. 12C
FIG. 12D
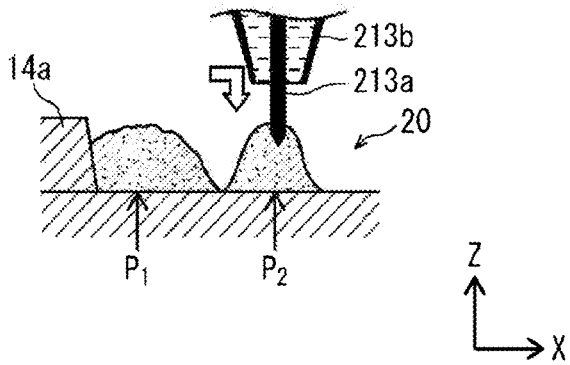
FIG. 12E
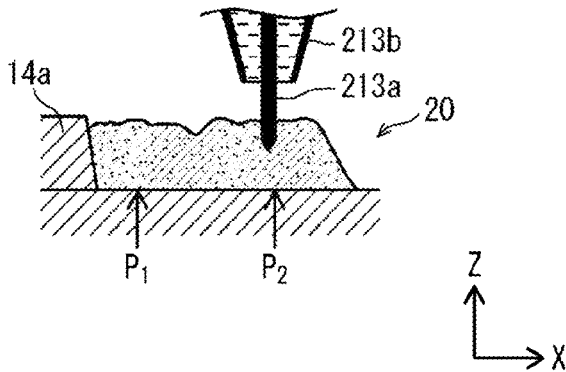
FIG. 12F
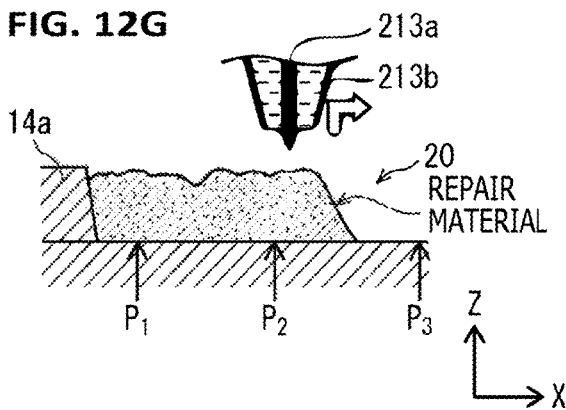
FIG. 12G

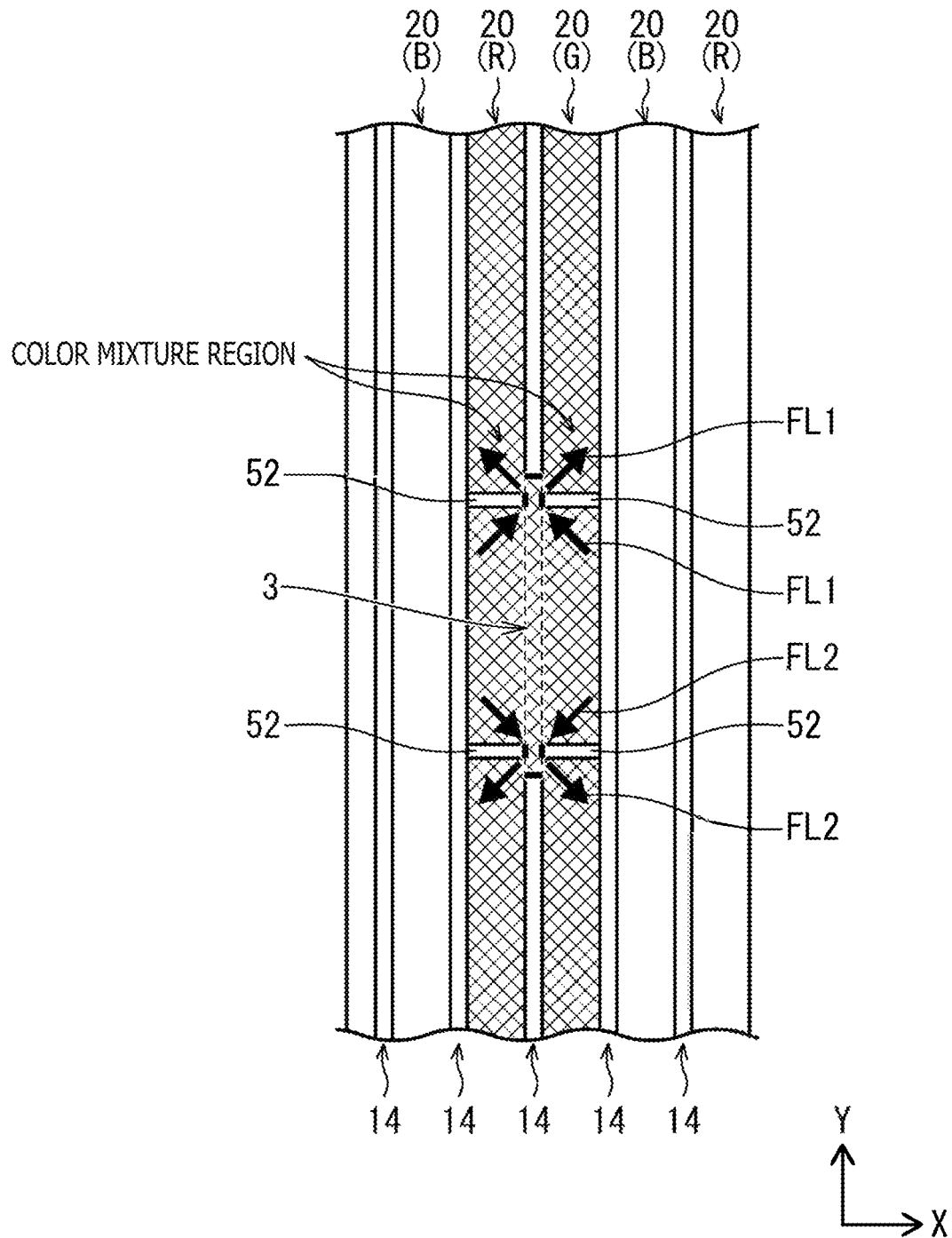

ORGANIC EL DISPLAY PANEL AND METHOD FOR MANUFACTURING ORGANIC EL DISPLAY PANEL

CROSS REFERENCE TO RELATED APPLICATIONS

This application is a U.S. National Phase of International Patent Application No. PCT/JP2020/004675 filed on Feb. 6, 2020, which claims priority benefit of Japanese Patent Application No. JP 2019-021506 filed in the Japan Patent Office on Feb. 8, 2019. Each of the above-referenced applications is hereby incorporated herein by reference in its entirety.

TECHNICAL FIELD

The present disclosure relates a method for manufacturing an organic electro luminescence (EL) display panel in which organic EL elements utilizing an electroluminescence phenomenon of an organic material are arranged in an array, and particularly to a step of forming a bank.

BACKGROUND ART

In recent years, an organic EL display panel has been placed into practical use as a display apparatus of the light emitting type. In an organic EL display panel, each organic EL element is a light emitting element of the current driven type that has a basic structure in which a light emitting layer containing an organic light emitting material is arranged between paired electrodes, that is, an anode and a cathode. When the light emitting element is to be driven, a voltage is applied between the paired electrodes such that light is emitted by recombination of holes injected from the anode into the light emitting layer and electrons injected from the cathode into the light emitting layer. In an organic EL display panel for color display, organic EL elements form subpixels of RGB colors and RGB subpixels adjacent to each other cooperatively form one pixel.

In manufacture of an organic EL display panel, a substrate is partitioned into regions with banks, and a light emitting layer is formed in each region. The banks are formed by patterning a photosensitive thermosetting resin into bank shapes by a photolithography method and then heating and baking them.

For formation of the light emitting layer, a wet method is often used by which an ink, for forming a light emitting layer, containing a polymer material or a low molecular weight material having a good thin film formation property is applied to recessed spaces partitioned with the banks, by an ink jet method or another method. According to this wet method, also in a large size panel, organic functional layers including the light emitting layer can be formed comparatively easily.

If a bank suffers from partial collapse therein in the manufacturing process of such an organic EL display panel as described above, then when a light emitting layer is to be formed at a subsequent step, inks of different colors applied across the bank having the defective portion are sometimes mixed to cause color mixture. In this case, the emission color within the area within which such color mixture occurs sometimes becomes different from the original emission color or is recognized as a dark point in error, resulting in deterioration of the display quality. Especially, in a configuration in which banks extending in a column direction are provided, there is the possibility that the color mixture may expand to a plurality of pixels along the bank and cause significant deterioration of the display quality.

Therefore, for example, PTL 1 and PTL 2 disclose a technology of applying a thermosetting repair material in the form of a paste to a position spaced by a predetermined distance from a defective portion existing in a bank and then heating and baking the repair material to form a dam, to thereby suppress expansion of color mixture.

CITATION LIST

Patent Literature

[PTL 1]
   Japanese Patent Laid-Open No. 2016-71992
[PTL 2]
   Japanese Patent Laid-Open No. 2017-33813

SUMMARY

Technical Problem

However, it may be sometimes difficult for the method disclosed in PTL 1 to suppress, in a manufacturing process, expansion of color mixture that is caused by a defect of a form in which part of an elongated bank is missing.

Taking the problem described above into consideration, it is an object of the present disclosure to provide a method for manufacturing an organic EL display panel and an organic EL display panel by which, when part of an elongated bank is missing in the manufacturing process of an organic EL display panel, the range of subpixels within which the display quality is deteriorated by the missing can be restricted.

Solution to Problem

A method for manufacturing an organic EL display panel according to one aspect of the present disclosure include a step of preparing a substrate, a step of forming a plurality of pixel electrodes arranged in a matrix on an upper face of the substrate, a step of forming, between the pixel electrodes adjacent to each other at least in a row direction on the substrate, a plurality of elongated banks extending in a column direction and formed in parallel to each other, a step of detecting a missing portion at which part of the elongated banks does not exist, a step of forming, above the pixel electrodes, a pair of repair banks in each of two gaps between a bank in which the missing portion has been detected and banks adjacent on opposite sides in the row direction of the column bank, a step of forming a light emitting layer by applying an ink that contains an organic light emitting material to each of gaps between the plurality of banks, and a step of forming a common electrode above the light emitting layer. The step of forming the pair of repair banks includes a first step of forming a pair of repair row banks at positions spaced by a predetermined distance or more in the column direction above the pixel electrodes that exist in the two gaps and whose positions in the column direction are same, at least at part thereof, as that of the missing portion, and a second step of forming repair column banks that connect, in the column direction, an end portion of each of the repair row banks that are not connected in the row direction to the bank that has the missing portion to a closest portion of the column bank.

Further, an organic EL display panel according to one aspect of the present disclosure includes a substrate, a plurality of pixel electrodes arranged in a matrix on an upper face of the substrate, a plurality of elongated column banks that are extending in a column direction and are formed in parallel to each other between the pixel electrodes adjacent to each other at least in a row direction on the substrate, a missing portion at which part of the elongated column banks does not exist, a pair of repair banks formed, above the pixel electrodes, in each of two gaps between a column bank that has the missing portion and column banks adjacent on opposite sides in the row direction of the column bank, a light emitting layer composed of an application film formed in each of gaps between the plurality of column banks, and a common electrode provided above the light emitting layer. The repair banks include a pair of repair row banks formed at positions spaced by a predetermined distance or more in the column direction above the pixel electrodes that exist in the two gaps and whose positions in the column direction are same, at least at part thereof, as that of the missing portion, and repair column banks that connect, in the column direction, an end portion of each of the repair row banks that are not connected in the row direction to the column bank that has the missing portion to a closest portion of the column bank.

Advantageous Effect of the Invention

With the display panel and the method for manufacturing a display panel according to the one aspect of the present disclosure, when part of an elongated bank is missing in the manufacturing process, the range of subpixels in which the display quality is deteriorated by the missing in a completed organic EL display panel can be restricted to subpixels that include pixel electrodes whose positions in the column direction are same, at least at part thereof, as that of the missing portion.

BRIEF DESCRIPTION OF DRAWINGS

FIGS. 7A, 7B, 70, 7D, and 7E are schematic sectional views depicting parts of manufacturing steps of the display panel according to the embodiment.

FIGS. 12A, 12B, 12C, 12D, 12E, 12F, and 12G are schematic sectional views depicting a manner in which a dam portion is formed by applying a repair material by the needle dispenser. FIG. 12A is a schematic sectional view depicting a state of a tank and a needle in a state before the repair material is applied. FIG. 12B is a schematic sectional view depicting a state in which the repair material attached to the needle is applied to an application point P1. FIG. 12C is a schematic sectional view depicting a state while the needle is being moved upward. FIG. 12D is a schematic sectional view depicting a state in which the needle has been moved upward. FIG. 12E is a schematic sectional view depicting a state in which the needle and the tank are moved and the repair material is applied to an application point P2. FIG. 12F is a schematic sectional view depicting a state in which the repair material applied to the application point P1 and the repair material applied to the application point P2 are connected. FIG. 12G is a schematic sectional view depicting a state in which the needle has been moved upward.

FIG. 16 is a schematic plan view depicting a state in which an ink layer is formed on the display panel according to the comparative example.

DESCRIPTION OF EMBODIMENTS

<Circumstances Leading to Mode for Carrying Out the Present Invention>

In a method for manufacturing an organic EL display panel of the line bank structure, a light emitting layer is formed by forming a plurality of elongated banks extending in a column direction and formed in parallel to each other on a substrate and applying inks containing organic light emitting materials to gaps between the plurality of banks. According to the organic EL display panel of the line bank structure, since each ink is movable in the gaps along the banks, the dispersion in film thickness at the point of time of application of the ink is uniformized by flow of the ink, and a light emitting layer of a uniform film thickness can thus be formed. As a result, an organic EL display panel having little luminance unevenness can be manufactured. However, if a defect exists in a bank, then there is the possibility that the ink applied in a gap may advance into an adjacent gap through the defect, resulting in production of a color mixture region in which inks of different emission colors are mixed. Especially, in the organic EL display panel of the line bank structure, since mixed inks flow along the banks, there is the possibility that deterioration of the display quality may occur over a plurality of pixels.

As a method for repairing a defect of a line bank, for example, a technology is disclosed in PTL 1 and PTL 2 bp which dams are formed at positions of a predetermined distance in a column direction from a defect in gaps on opposite sides in a row direction of the defect to thereby restrict occurrence of deterioration of the display quality caused by color mixture to subpixels on the opposite sides in the row direction of the defect.

However, in regard to a defect in the form of missing part of an elongated bank in a manufacturing process, in a case where the missing portion has a predetermined length in a longitudinal direction, the method described in PTL 1 is sometimes difficult to suppress expansion of color mixture.

Figure 17A:
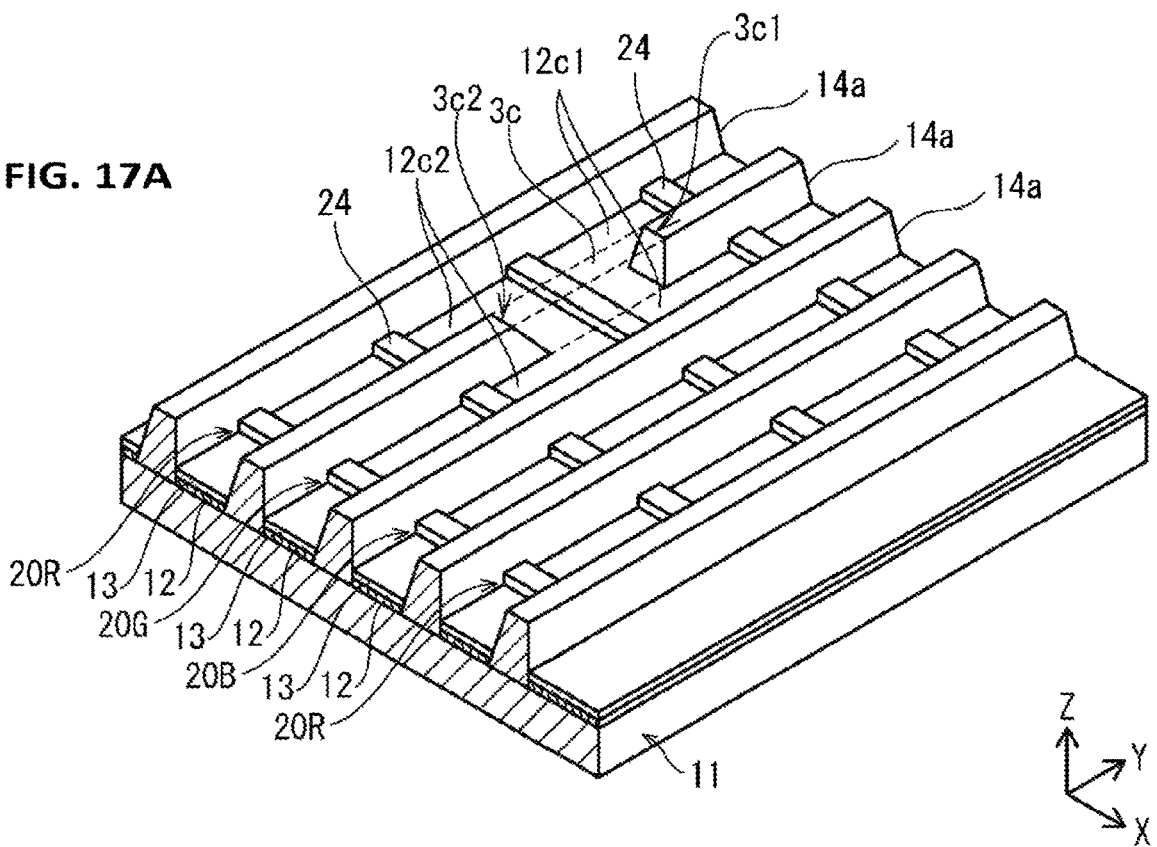
FIG. 17A is a schematic perspective view depicting an example of a missing portion occurring in a bank.

FIG. 17A is a schematic perspective view depicting an example of a missing portion occurring in a bank of a display panel that includes elongated banks.

Figure 17B:
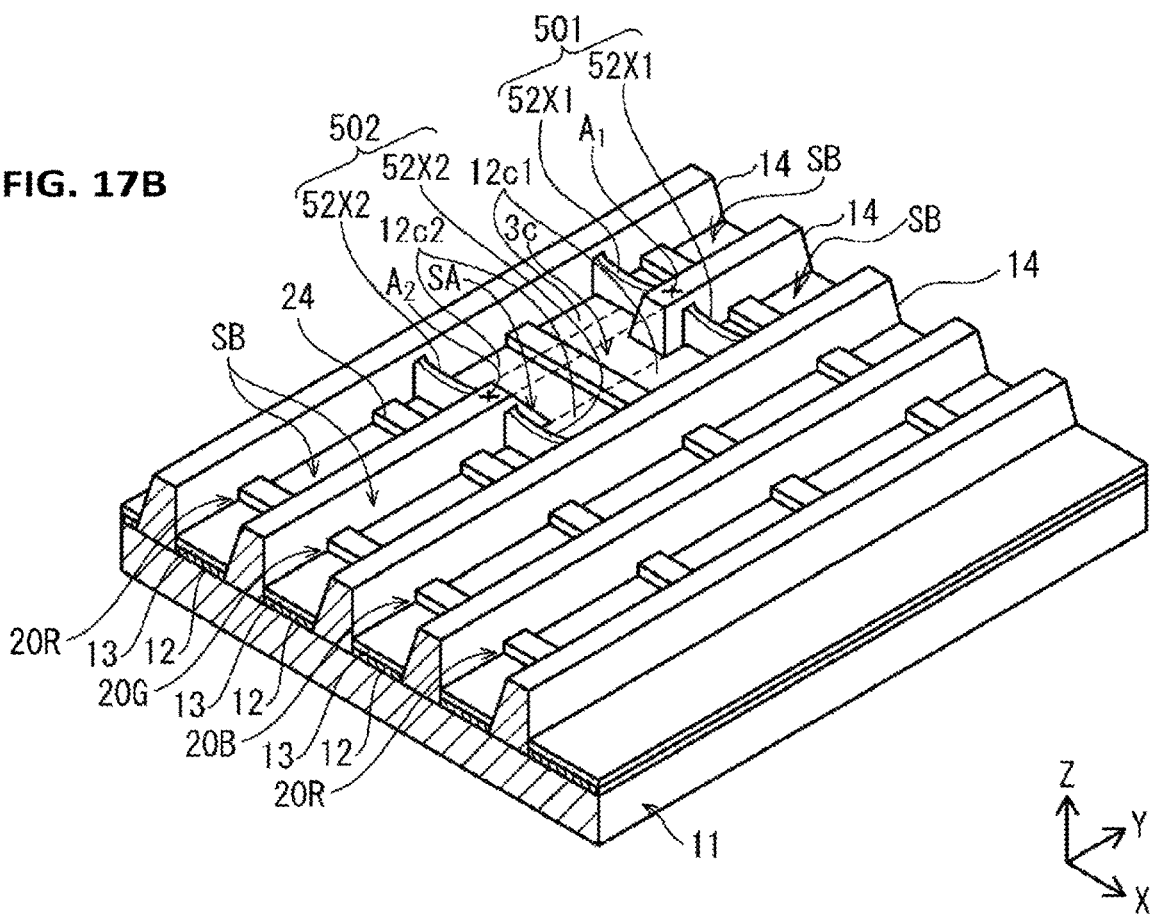
FIG. 17B is a schematic perspective view depicting a state in which dam portions conceived by the present inventors are formed around the missing portion.

As depicted in FIGS. 17A and 17B, the display panel includes, as main components thereof, a base substrate 11, pixel electrodes 12 arranged in a matrix in X and Y directions, a hole injection layer 13, column banks 14a extending in the Y direction (column direction) and row banks 24 of lower height extending in the X direction (row direction), both the column banks 14a and the row banks 24 being arranged between the pixel electrodes 12, an organic light emitting layer, an electron transport layer, a common electrode, and a sealing layer. Further, light emitting elements having organic light emitting layers each corresponding to one of emission colors of red (R), green (G), and blue (B) are arranged as subpixels in a matrix corresponding to the pixel electrodes 12. It is to be noted that FIG. 17A depicts a state before baking of the column banks 14a before the electron transport layer, the common electrode, and the sealing layer are formed in the manufacturing process.

As depicted in FIG. 17A, the display panel has a missing portion 3c at which part of a column bank 14a is missing from a surface of the base substrate 11 and part of the elongated column bank 14a does not exist. Opposite ends 3c1 and 3c2 of the missing portion 3c are positioned on pixel electrodes 12c1 and 12c2, respectively, and the missing portion 3c has such a positional relation that the position thereof in the Y direction is same, at least at part thereof, as those of the two pixel electrodes 12c1 and 12c2. Therefore, according to the method for forming dams at positions spaced by a predetermined distance in the Y direction from a defective portion as disclosed in PTL 1, it is difficult to suppress expansion of color mixture.

Figure 19A:
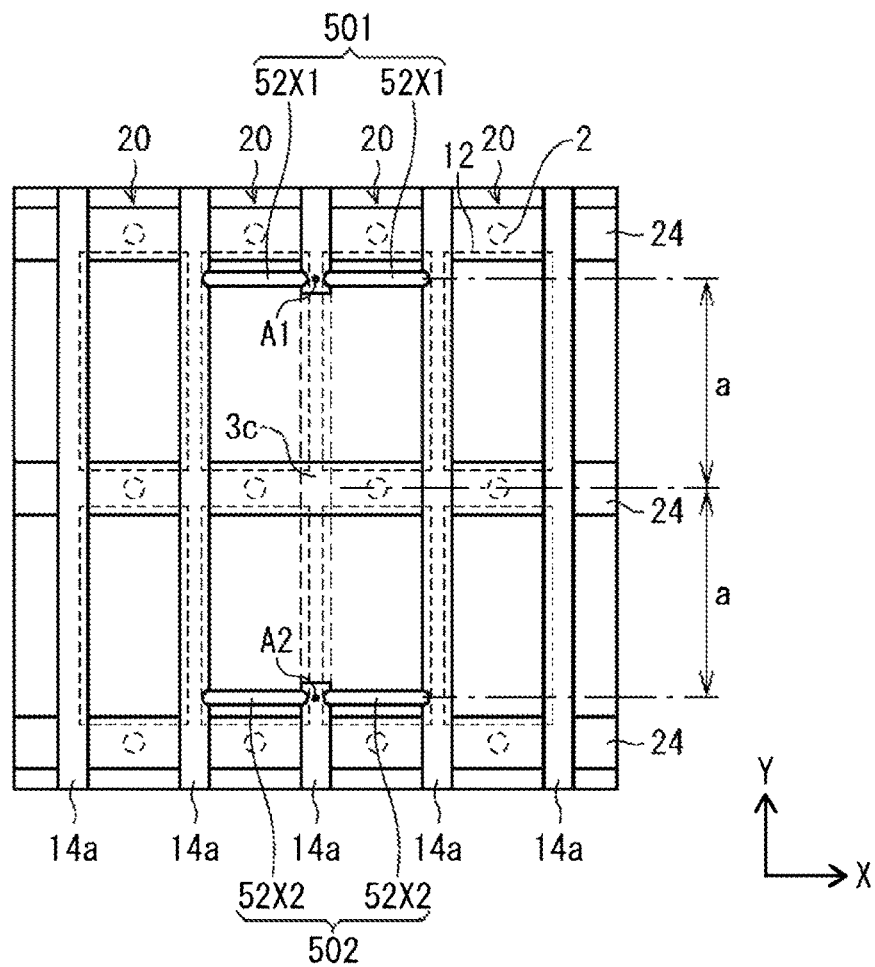
FIG. 19A is a schematic plan view depicting a state in which the dam portions of FIG. 17B are formed.

In contrast, FIG. 17B is a schematic perspective view depicting a form of a display panel in which dam portions conceived by the inventors are formed for the missing portion 3c. FIG. 19A is a schematic plan view depicting a state in which the dam portions of FIG. 17B are formed. It is to be noted that FIG. 17B depicts a state after baking of the column banks 14a before the electron transport layer, the common electrode, and the sealing layer are formed in the manufacturing process.

In the form of the display panel depicted in FIG. 17B, paired repair row banks 52X1 and 52X2 are formed at positions A1 and A2 spaced by a predetermined distance 2×a in the column direction above the pixel electrodes 12c1 and 12c2, respectively, in each of two gaps 20 between a column bank 14 in which a missing portion 3c exists and adjacent column banks 14 on the opposite sides in the row direction of the column bank 14. Here, the positions A1 and A2 may be positions at which the distance in the Y direction is in the maximum, above the pixel electrodes 12c1 and 12c2, respectively. In this case, the repair row banks 52X1 and 52X2 are individually formed to configure dams 501 and 502 such that the dams 501 and 502 partition the gaps 20 into a first space SA formed from a space portion adjacent to the missing portion 3c and two second spaces SB each formed from a space portions that is not adjacent to the missing portion 3c. Consequently, color mixture can be restricted to the inside of the first space SA, and mixed ink can be suppressed from flowing into the second spaces SB.

Figure 18A:
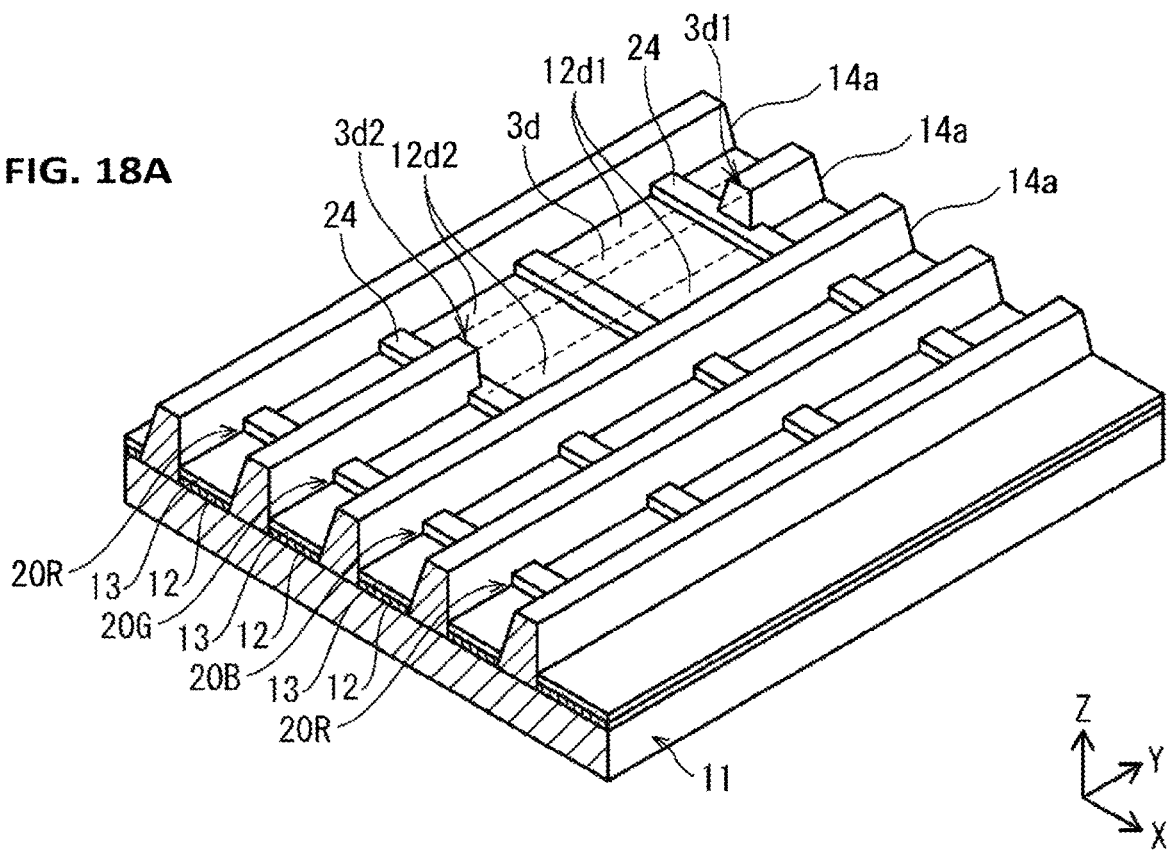
FIG. 18A is a schematic perspective view depicting another example of a missing portion occurring in a bank.
Figure 18B:
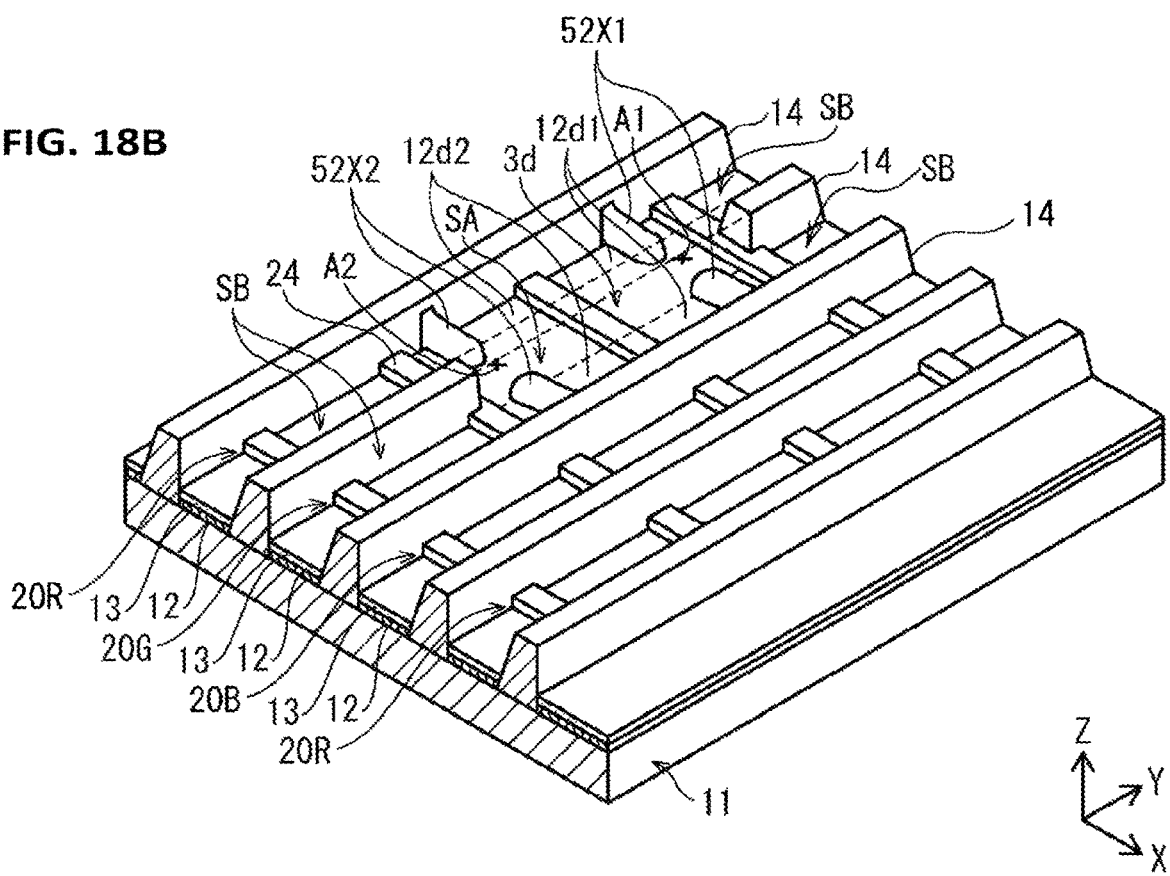
FIG. 18B is a schematic perspective view depicting a state in which dam portions conceived by the inventors are formed around the missing portion.
Figure 19B:
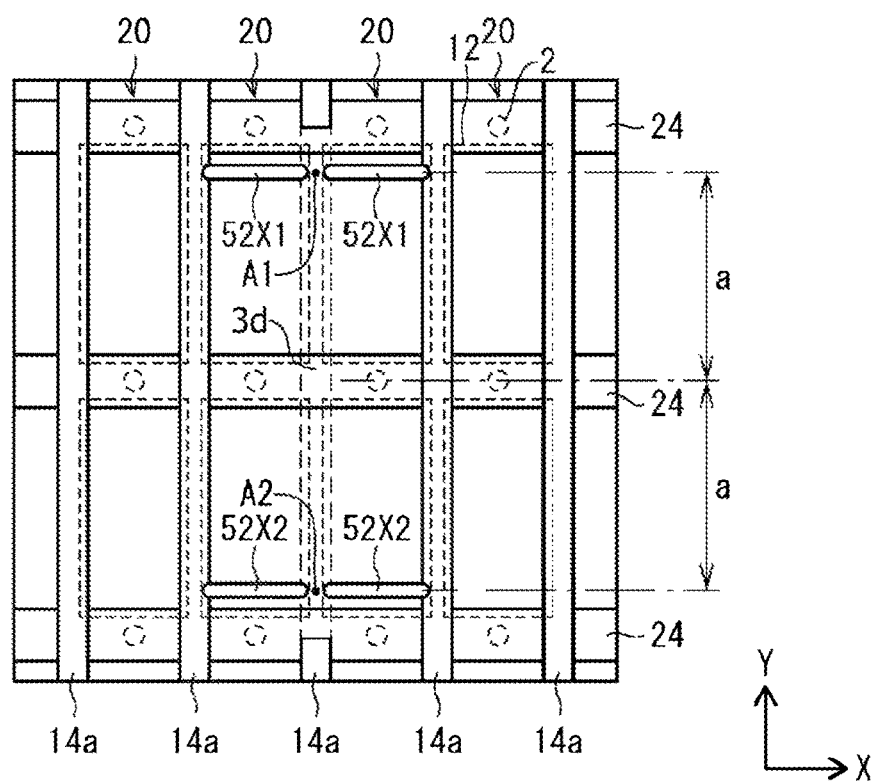
FIG. 19B is a schematic plan view depicting a state in which the dam portions of FIG. 18B are formed.

On the other hand, a method depicted in FIG. 18B in which the missing portion 3c is further expanded in the Y direction until the opposite ends 3d1 and 3d2 of the missing portion 3d are positioned on the row banks 24 fails to suppress expansion of color mixture. FIG. 18A is a schematic perspective view depicting another example of a missing portion that occurs in a bank, and FIG. 18B is a schematic perspective view depicting a state in which dam portions conceived by the inventors are formed around a missing portion. FIG. 19B is a schematic plan view depicting a state in which the dam portions of FIG. 18B are formed.

As depicted in FIG. 18A, the missing portion 3d has a position in the Y direction same as those of the two pixel electrodes 12d1 and 12d2 and has a position overlapping in the Y direction part of the row banks 24 between which the pixel electrodes 12d1 and 12d2 are sandwiched in the Y direction.

Therefore, such a method as depicted in FIG. 17B by which pairs of repair row banks 52X1 and 52X2 are formed at the positions A1 and A2 spaced by the predetermined distance 2×a in the column direction above pixel electrodes 12d1 and 12d2, respectively, fails to dam up the gaps 20 positioned on the opposite sides in the X direction of the missing portion 3d and fails to partition the gaps 20 into the first space SA adjacent to the missing portion 3d and the second spaces SB that are not adjacent to the missing portion 3d. Therefore, the mixed color ink flows out from within the first space SA into the second spaces SB to thereby expand color mixture.

Therefore, the inventors have intensively studied a structure for damming up, in a case in which a missing portion has a position overlapping in the Y direction part of a row bank in addition to pixel electrodes, the gaps 20 located on the opposite sides in the X direction of a column bank having the missing portion and a method for manufacturing the structure, and have come up with the method for manufacturing an organic EL display panel and the organic EL display panel according to the present disclosure.

<<Overview of Modes for Carrying Out the Invention>>

An organic EL display panel according to an embodiment of the present disclosure includes a substrate, a plurality of pixel electrodes arranged in a matrix on an upper face of the substrate, a plurality of elongated column banks that are extending in a column direction and are formed in parallel to each other between the pixel electrodes adjacent to each other at least in a row direction on the substrate, a missing portion at which part of the elongated column banks does not exist, a pair of repair banks formed, above the pixel electrodes, in each of two gaps between a column bank that has the missing portion and column banks adjacent on opposite sides in the row direction of the column bank, a light emitting layer composed of an application film formed in each of gaps between the plurality of column banks, and a common electrode provided above the light emitting layer. The repair banks include a pair of repair row banks formed at positions spaced by a predetermined distance or more in the column direction above the pixel electrodes that exist in the two gaps and whose positions in the column direction are same, at least at part thereof, as that of the missing portion, and repair column banks that connect, in the column direction, an end portion of each of the repair row banks that are not connected in the row direction to the column bank that has the missing portion to a closest portion of the column bank.

With such a configuration as just described, when part of an elongated bank is missing in a manufacturing process, the range of subpixels in which the display quality is deteriorated by the missing in a completed organic EL display panel can be restricted to subpixels including pixel electrodes whose positions in the column direction are same, at least at part thereof, as that of the missing portion.

Further, in another aspect, the organic EL display panel according to the aspect described above may be configured such that the pair of repair row banks are formed at positions at which the distance in the column direction is in the maximum.

With such a configuration as just described, the repair banks can be formed in a maximum range in which the color mixture region is included in subpixels whose positions in the Y direction are same, at least at part thereof, as that of the missing portion.

Further, in a further aspect, the organic EL display panel according to any one of the aspects described above may be configured such that, of the light emitting layer formed in one of the two gaps, a portion that is formed in a range sandwiched by the pair of repair row banks contains an organic light emitting material that is contained in the light emitting layer formed in the other gap opposing in the row direction across the missing portion, and a portion that is formed outside the range sandwiched by the pair of repair row banks does not contain the organic light emitting material that is contained in the light emitting layer formed in the opposing gap.

With such a configuration as just described, the color mixture region is restricted to a range of subpixels whose positions in the Y direction are same, at least at part thereof, as that of the missing portion, and the deterioration of the display quality caused by the color mixture can be restricted to within the subpixels that overlap, at least at part thereof, the missing portion in the Y direction.

Further, in a still further aspect, the organic EL display panel according to any one of the aspects described above may be configured such that it further includes a plurality of elongated row banks that are extending in the row direction and are formed in parallel to each other between the pixel electrodes adjacent to each other at least in the column direction on the substrate, and opposite ends of the missing portion in the column bank that has the missing portion are each positioned on an upper face of one of the row banks.

With such a configuration as just described, in a case where part of an elongated bank is missing in the manufacturing process and an end portion of the missing portion 3 in the Y direction is positioned on an upper face of a row bank, the range of subpixels whose display quality is deteriorated by the missing in a completed display panel can be restricted.

Further, in a yet further aspect, the organic EL display panel according to any one of the aspects described above may be configured such that, at portions of the pixel electrodes positioned below the row banks, a contact hole at which part of a surface of the pixel electrode is recessed is provided, and the repair column banks are formed at positions at which the repair column banks do not overlap the contact holes as viewed in plan.

With such a configuration as just described, it can be suppressed that the height of the repair column banks formed above the contact holes becomes insufficient by an amount of a height corresponding to the thickness of the flattening layer.

Meanwhile, a method for manufacturing an organic EL display panel according to an embodiment of the present disclosure includes a step of preparing a substrate, a step of forming a plurality of pixel electrodes arranged in a matrix on an upper face of the substrate, a step of forming, between the pixel electrodes adjacent to each other at least in a row direction on the substrate, a plurality of elongated column banks extending in a column direction and formed in parallel to each other, a step of detecting a missing portion at which part of the elongated column banks does not exist, a step of forming, above the pixel electrodes, a pair of repair banks in each of two gaps between a column bank in which the missing portion has been detected and column banks adjacent on opposite sides in the row direction of the column bank, a step of forming a light emitting layer by applying an ink that contains an organic light emitting material to each of gaps between the plurality of column banks, and a step of forming a common electrode above the light emitting layer. The step of forming the pair of repair banks includes a first step of forming a pair of repair row banks at positions spaced by a predetermined distance or more in the column direction above the pixel electrodes that exist in the two gaps and whose positions in the column direction are same, at least at part thereof, as that of the missing portion, and a second step of forming repair column banks that connect, in the column direction, an end portion of each of the repair row banks that are not connected in the row direction to the column bank that has the missing portion to a closest portion of the column bank.

With such a configuration as just described, an organic EL display panel can be manufactured in which, when part of an elongated bank is missing in a manufacturing process, the range of subpixels in which the display quality is deteriorated by the missing can be restricted to subpixels including pixel electrodes whose positions in the column direction are same, at least at part thereof, as that of the missing portion.

Further, in another aspect, the method for manufacturing an organic EL display panel according to the aspect described above may be configured such that, at the first step, the pair of repair row banks are formed at positions at which the distance in the column direction is in the maximum.

With such a configuration as just described, by forming repair row banks above the pixel electrodes at the formation step of repair banks, such a disadvantage that the height of the repair row banks formed on the upper face of the flattening layer becomes insufficient by an amount of a height corresponding to the thickness of the pixel electrodes and such a disadvantage that the material of the repair row banks gets wet and spreads onto the flattening layer or the row banks and flows before it is hardened can be suppressed.

Further, in a further aspect, the method for manufacturing an organic EL display panel according to any one of the aspects described above may be configured such that, at the step of forming the light emitting layer, of inks applied into one of the two gaps, an ink applied to a range sandwiched by the pair of repair row banks flows out through the missing portion into the other gap opposing in the row direction across the missing portion but is blocked within the range in the column direction by the pair of repair row banks.

With such a configuration as just described, a display panel can be manufactured in which the color mixture region is restricted to a range of subpixels whose positions in the Y direction are same, at least at part thereof, as that of the missing portion 3, and the deterioration of the display quality caused by the color mixture can be restricted to within the subpixels that overlap, at least at part thereof, the missing portion in the Y direction.

Further, in a still further aspect, the method for manufacturing an organic EL display panel according to any one of the aspects described above may be configured such that it further includes a step of forming, between the pixel electrodes that are adjacent to each other at least in the column direction on the substrate, a plurality of elongated row banks extending in the row direction and formed in parallel to each other, and opposite ends of the missing portion in the column bank that has the missing portion are each positioned on an upper face of one of the row banks.

With such a configuration as just described, a display panel can be manufactured in which, in a case where part of an elongated bank is missing in the manufacturing process and an end portion of the missing portion 3 in the Y direction is positioned on an upper face of a row bank, the range of subpixels whose display quality is deteriorated by the missing is restricted.

Further, in a yet further aspect, the method for manufacturing an organic EL display panel according to any one of the aspects described above may be configured such that it further includes a step of forming, at portions of the pixel electrodes positioned below the row banks, a contact hole at which part of a surface of the pixel electrode is recessed, and the repair column banks are formed at positions at which the repair column banks do not overlap the contact holes as viewed in plan.

With such a configuration as just described, a display panel can be manufactured in which it can be suppressed that the height of the repair column banks formed above the contact holes becomes insufficient by an amount of a height corresponding to the thickness of the flattening layer.

Embodiments

Figure 1:
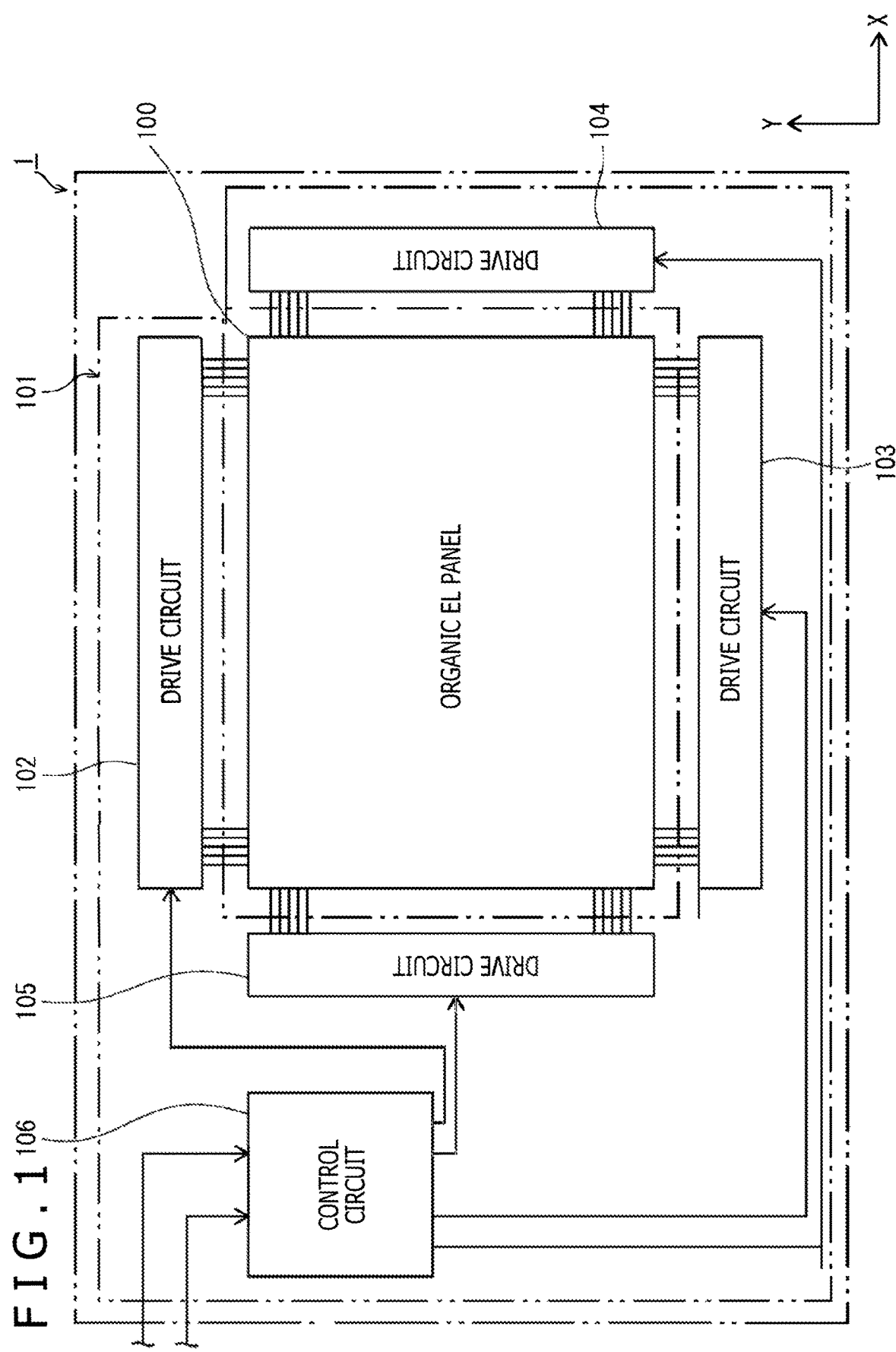
FIG. 1 is a schematic block diagram depicting an example of a configuration of an organic EL display apparatus according to an embodiment.

<General Configuration of Organic EL Display Apparatus>
FIG. 1 is a schematic block diagram depicting a configuration of an organic EL display apparatus 1 having a display panel 100 according to an embodiment.

Figure 2:
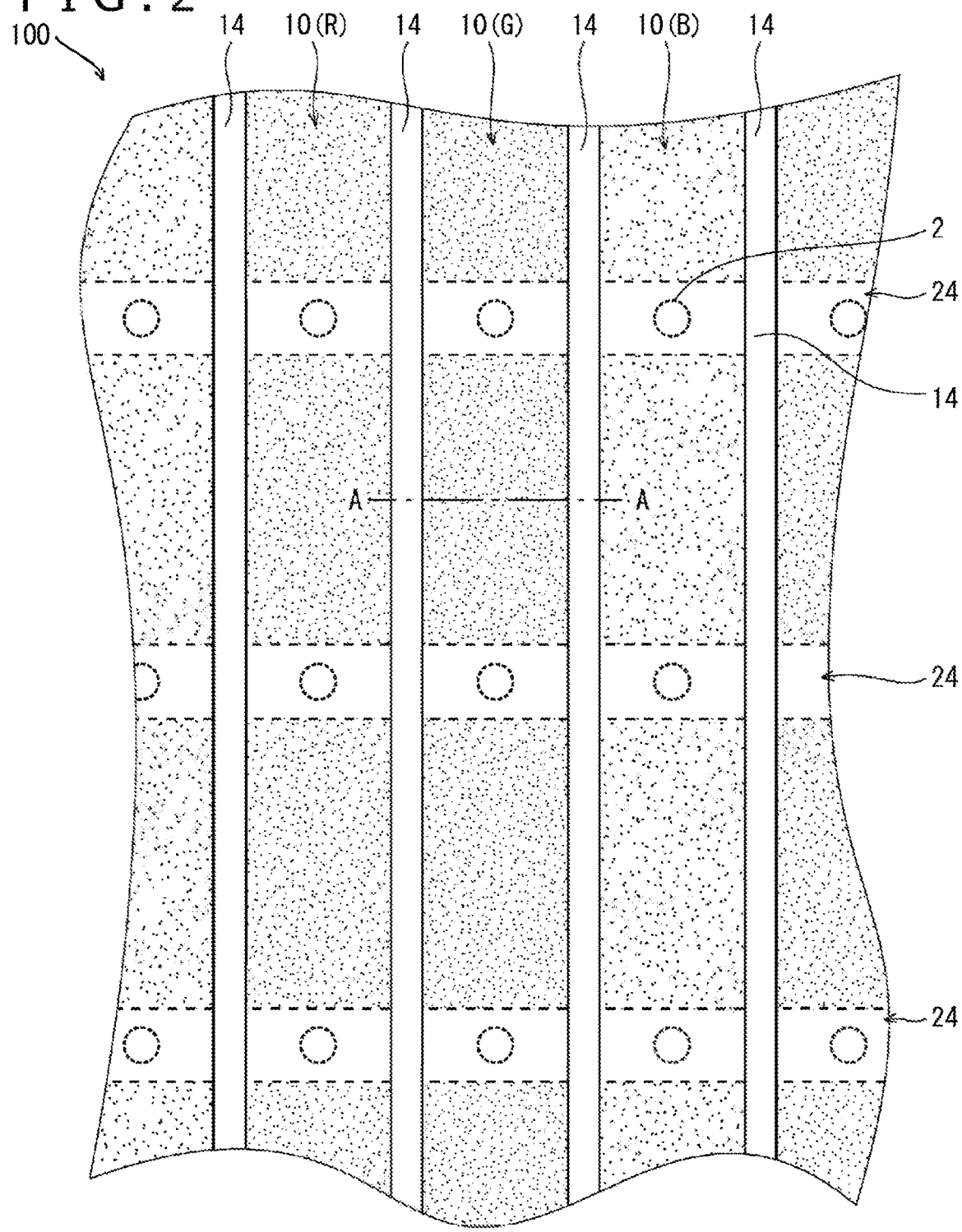
FIG. 2 is a partial plan view schematically depicting a display panel according to the embodiment.

As depicted in FIG. 1, the organic EL display apparatus 1 includes the display panel 100 and a drive controlling unit 101 connected to the display panel 100. The display panel 100 is a panel that utilizes an electroluminescence phenomenon of an organic material, and a plurality of light emitting elements (organic EL elements) 10 are arrayed in a matrix on a substrate as depicted in FIG. 2. The drive controlling unit 101 is configured from four drive circuits 102 to 105 and a control circuit 106.

It is to be noted that the arrangement of the drive controlling unit 101 with respect to the display panel 100 is not restricted to this.

Figure 3:
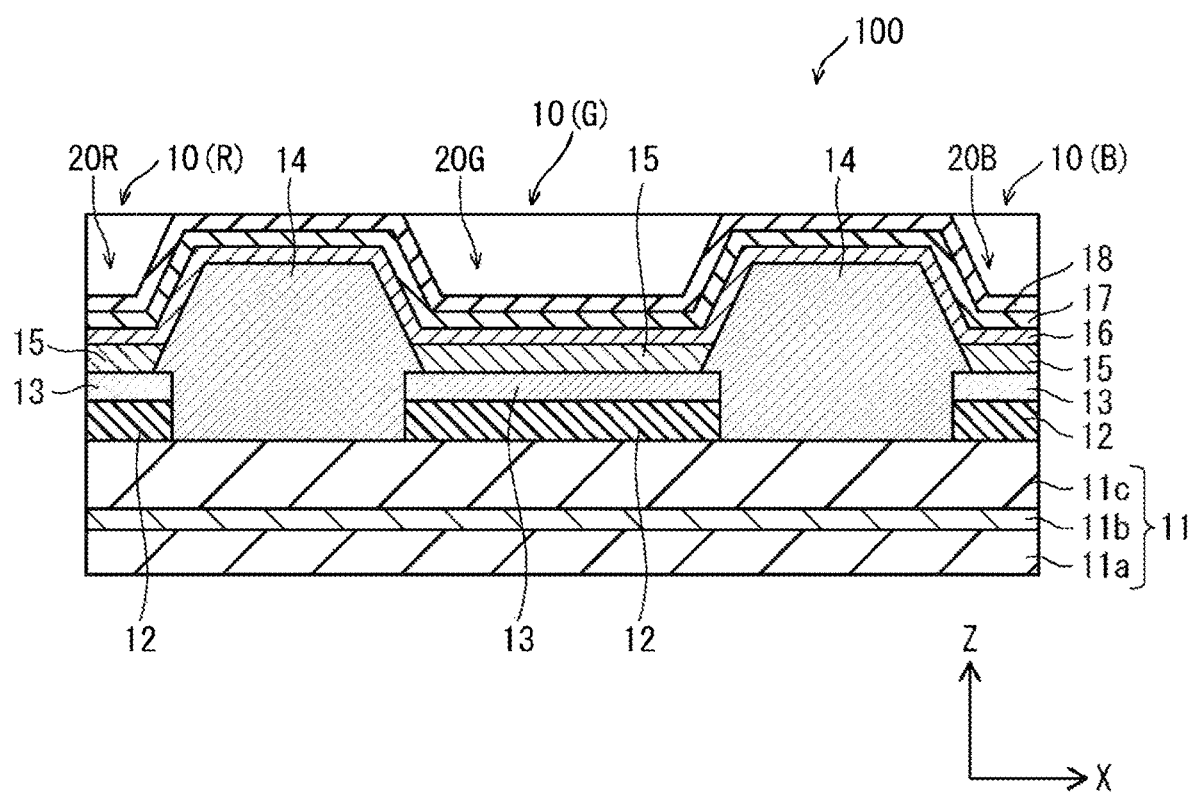
FIG. 3 is a partially enlarged sectional view of the display panel according to the embodiment, taken along line A-A' of FIG. 2.

<Configuration of Organic EL Display Panel>
FIG. 2 is a plan view schematically depicting a general configuration of the display panel 100 as viewed from a display face side. FIG. 3 is a partially enlarged sectional view of the display panel 100, taken along line A-A of FIG. 2. The display panel 100 is of what is generally called the top emission type and has the display face on a Z direction side thereof.

The configuration of the display panel 100 is described with reference to FIGS. 2 and 3.

As depicted in FIG. 3, the display panel 100 includes, as main components thereof, a base substrate 11, pixel electrodes 12, a hole injection layer 13, column banks 14, an organic light emitting layer 15, an electron transport layer 16, a common electrode 17, and a sealing layer 18.

The hole injection layer 13 and the electron transport layer 16 correspond to a functional layer, and the functional layer is structured so as to be sandwiched by the pixel electrodes 12 and the common electrode 17.

Thus, light emitting elements 10R, 10G, and 10B each having the organic light emitting layer 15 corresponding to an emission color of one of red (R), green (G), and blue (B) form subpixels, and such subpixels are arranged in a matrix as depicted in FIG. 2.

It is to be noted that FIG. 2 depicts a state in which the electron transport layer 16, the common electrode 17, and the sealing layer 18 are removed.

[Base Substrate]
The base substrate 11 has a substrate main body portion 11a, a thin film transistor (TFT) layer 11b, and a flattening layer 11c.

The substrate main body portion 11a is a portion that serves as a base of the display panel 100 and can be formed from any of insulating materials such as alkaline-free glass, soda glass, polycarbonate resin, polyester resin, and alumina. Further, the substrate main body portion 11a may otherwise be formed using a polyimide material.

The TFT layer 11b is provided for each of the subpixels on a surface of the substrate main body portion 11a, and a pixel circuit including a thin film transistor element is formed in each of the TFT layers 11b.

The flattening layer 11c is formed on the TFT layers 11b. The flattening layer 11c is made of an organic insulating material such as a polyimide resin, an acrylic resin, and a novolac type phenolic resin or an inorganic insulating material such as silicon oxide (SiO) or silicon nitride (SiN), and has a function of ensuring electric insulation between the TFT layers 11b and the pixel electrodes 12 and flattening, even if a step exists on an upper face of a TFT layer 11b, the step to suppress an influence of the step on the base face configuring the pixel electrodes 12.

[Pixel Electrode]
The pixel electrodes 12 are each a pixel electrode provided individually for each subpixel on the base substrate 11 and is made of a light-reflecting conductive material such as silver (Ag), aluminum (Al), an aluminum alloy, molybdenum (Mo), or an alloy of silver, palladium, and copper (APC). In the present embodiment, the pixel electrode 12 serves as an anode.

It is to be noted that a known transparent conductive film may be provided further on surfaces of the pixel electrodes 12. As a material for the transparent conductive film, for example, indium tin oxide (ITO) or indium zinc oxide (IZO) can be used. The transparent conductive film is interposed between the pixel electrodes 12 and the hole injection layer 13 and has a function of improving bondability between the layers.

[Hole Injection Layer]

The hole injection layer 13 is a layer made of an oxide of, for example, silver (Ag), molybdenum (Mo), chromium (Cr), vanadium (V), tungsten (W), nickel (Ni), or iridium (Ir) or a conductive polymer material such as PEDOT (mixture of polythiophene and polystyrene sulfonic acid). Of the above, the hole injection layer 13 made of a metal oxide has a function of stably assisting holes, or assisting generation of holes, to inject and transport holes into and to the organic light emitting layer 15.

[Bank]

On a surface of the hole injection layer 13, a plurality of column banks 14 each having a strip shape as viewed in plan are provided in parallel such that they extend along the Y direction (column direction). Such column banks 14 are made of an insulating organic material (for example, an acrylic resin, a polyimide resin, a novolac type phenol resin, or other resins).

A cross section of each column bank 14 has a trapezoidal shape as depicted in FIG. 3, and between the column banks 14, gaps 20 (20R, 20G, and 20B) partitioned by the column banks 14 are formed. On a bottom of each gap 20, a plurality of pixel electrodes 12 are provided in a line in the Y direction, and a hole injection layer 13, an organic light emitting layer 15, and an electron transport layer 16 are formed as the functional layer on each pixel electrode 12.

The column bank 14 partitions light emitting elements 10 adjacent to each other in the X direction from each other and has a function also as a structure for suppressing applied inks from overflowing when the organic light emitting layer 15 is formed by a wet method.

A row bank 24 has a height smaller than that of the column bank 14 (refer to FIG. 7), and is formed between a pixel electrode 12 and another pixel electrode 12 adjacent to each other in the Y direction in each gap 20 and partitions light emitting elements 10 adjacent to each other in the Y direction from each other. In other words, the display panel 100 is an organic EL display panel having what is generally called a line bank.

In the plurality of gaps 20, the positions in the Y direction of the plurality of row banks 24 formed therein are same as each other. Each row bank 24 extends in the X direction (row direction) and passes under a column bank 14 to be connected to an adjacent row bank 24 such that it has a shape of a strip extending in the X direction. Accordingly, on the base substrate 11, the column banks 14 and the row banks 24 are formed in a lattice as a whole (refer to FIG. 2).

[Missing Portion of Column Bank]

A missing portion 3 existing in a column bank 14a is described.

In the display panel 100, the missing portion 3 is a region in which part of the column bank 14a is missing from the surface of the flattening layer 11c such that part of the elongated column bank 14a does not exist. Such missing of the column bank 14a occurs incidentally in manufacture of the column banks 14a. For example, such missing occurs where sufficient polymerization is not made because of insufficient light exposure at a step of exposure for a bank material layer and the material there is washed away at a subsequent development step. In a case where the missing portion 3 is produced in this manner, color mixture occurs between ink layers 15a formed in gaps adjacent to each other through the missing portion 3. Therefore, since the location of the column bank 14a at which the missing portion 3 is produced makes a cause of emission color failure by color mixture of inks of different emission colors, the location is determined as a defect.

Figure 4A:
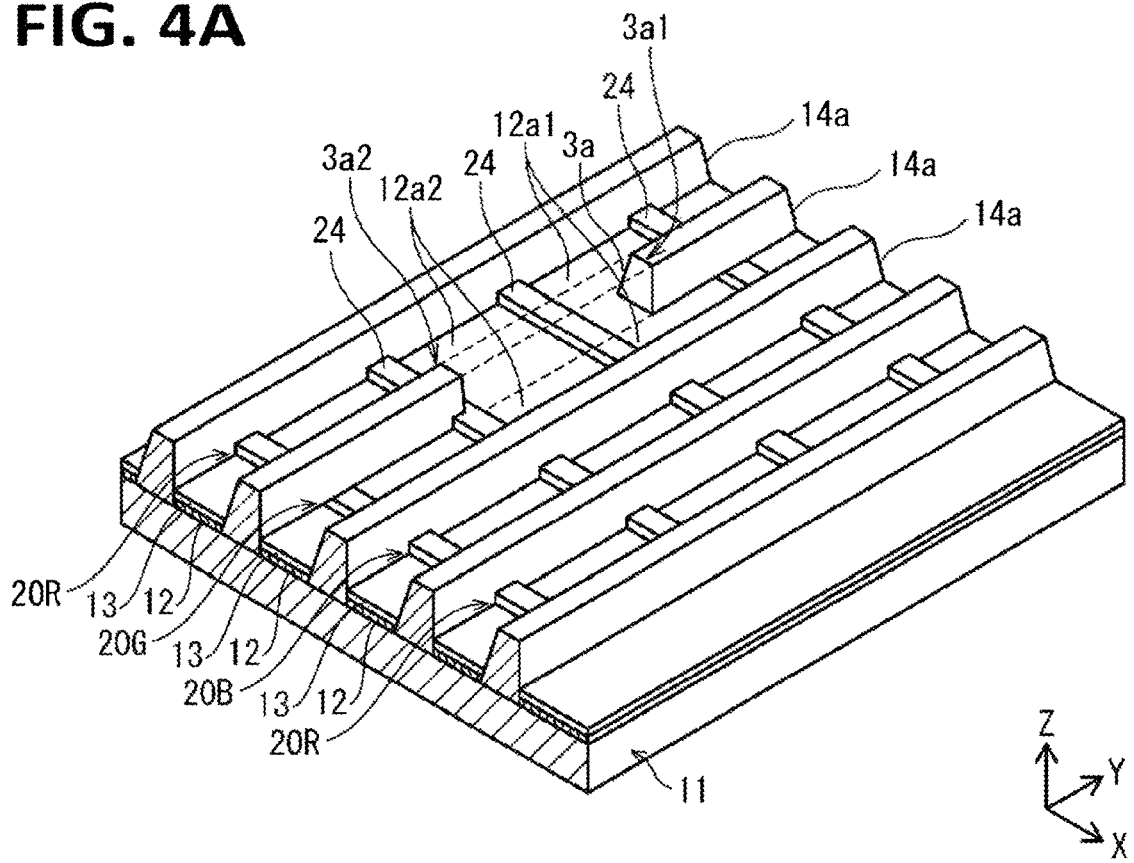
FIG. 4A is a schematic perspective view depicting an example of a missing portion 3a that occurs in a column bank 14a, and FIG. 4B is a schematic perspective view depicting a state in which a pair of repair banks 52X1 and a pair of banks 52X2 and 52Y2 are formed so as to sandwich the missing portion 3a therebetween in a Y direction.

FIG. 4A is a schematic perspective view depicting an example of a missing portion 3a produced in a column bank 14a. In FIG. 4A, one end 3a1 in the Y direction of the missing portion 3a is positioned between row banks 24 adjacent to each other in the Y direction, and the other end 3a2 of the missing portion 3a is positioned on a row bank 24.

Figure 5A:
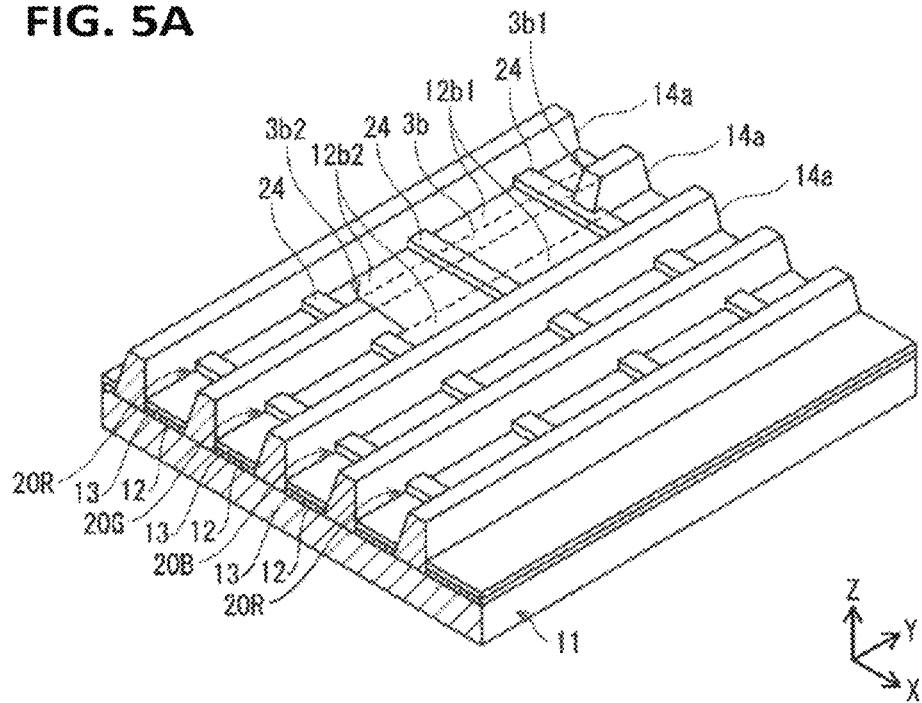
FIG. 5A is a schematic perspective view depicting an example of a missing portion 3b that occurs in a column bank 14a and is longer than the missing portion 3a, and FIG. 5B is a schematic perspective view depicting a state in which pairs of repair banks 52X1 and 52Y1 and pairs of repair banks 52X2 and 52Y2 are formed so as to sandwich the missing portion 3b therebetween in the Y direction.

Meanwhile, FIG. 5A is a schematic perspective view depicting an example of a missing portion 3b that is produced in a column bank 14a and is longer than the missing portion 3a. In FIG. 5A, one end 3b1 in the Y direction of the missing portion 3b is positioned on a row bank 24, and also the other end 3b2 of the missing portion 3b is positioned on a different row bank 24. It is to be noted that, in the present specification, where the missing portions 3a and 3b are not distinguished from each other, each of them is referred to as a missing portion 3.

It is to be noted that a defect that occurs in a column bank 14a is not limited to such missing portions 3 as described above. In a case where a foreign article enters one column bank 14a and penetrates a wall face of the column bank 14 to an adjacent gap 20, it can be said that a defect occurs. For example, in a case where a foreign article sticks to a column bank 14a and makes a defect, or in a case where a foreign article exists in or under a column bank 14a, if the close contact between the foreign article and the bank material is low, a gap is generated and forms a flow path for the ink, resulting in production of a defect. Accordingly, this makes a cause of color mixture that occurs between ink layers 15a formed in gaps adjacent to each other with the foreign article interposed therebetween. The present disclosure makes it an object to repair the missing portions 3 among various defects.

[Repair Bank]

In the case where there is a missing portion 3 in which part of an elongated column bank 14 is missing, a configuration is adopted in which a pair of repair banks 52 are formed in each of two gaps 20 between the column bank 14 in which the missing portion 3 exists and adjacent column banks 14 on the opposite sides of the column bank 14 in the row direction.

In the following, a configuration of the repair banks 52 is described.

Figure 4B:
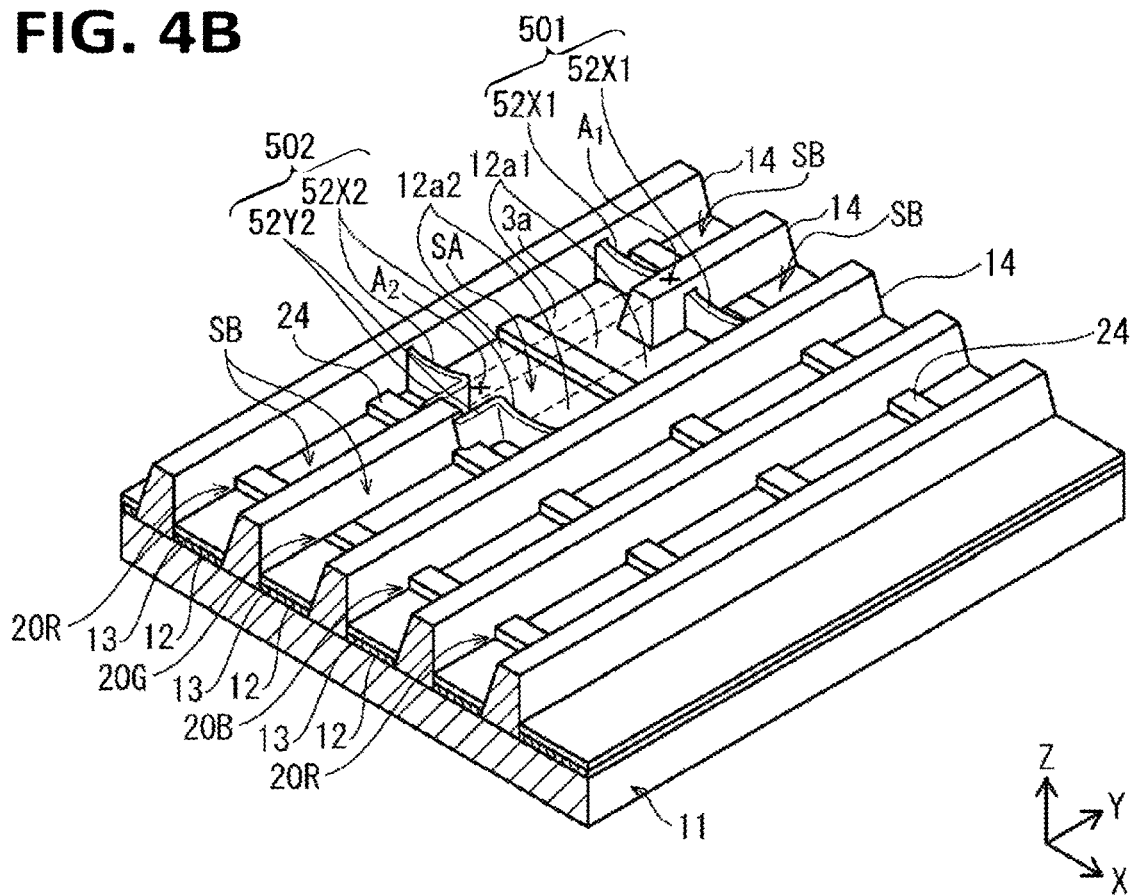

FIG. 4B is a schematic perspective view depicting a state where a pair of repair banks 52X1 and a pair of banks 52X2 and 52Y2 are formed such that a missing portion 3a is interposed therebetween in the Y direction. As depicted in FIG. 4B, pairs of repair row banks 52X1 and 52X2 (where they are not distinguished from each other, each of them is referred to as a repair row bank 52X) are formed at positions A1 and A2 spaced by a predetermined distance or more in the column direction above pixel electrodes 12a1 and 12a2 (where they are not distinguished from each other, each of them is referred to as a pixel electrode 12a) that have a same position in the Y direction, at least at part thereof, as that of the missing portion 3a. Here, the positions A1 and A2 are positions at which the distance in the Y direction is in the maximum, above the pixel electrodes 12a1 and 12a2.

At this time, by forming the pairs of repair row banks 52X1 and 52X2 above the pixel electrodes 12a1 and 12a2, the number of subpixels that become dark spots can be minimized.

Further, in a case where a repair row bank 52X is formed, for example, on a row bank 24, since both of them are made of an organic material, they are high in affinity, and therefore, the material of the repair row bank 52X is liable to get wet and spread on the row bank 24 and cannot be formed with a sufficient height as a dam of the repair row bank 52X in some cases. In contrast, if a repair row bank 52X is formed above a pixel electrode 12 as depicted in FIG. 4B, a necessary height can be secured for the repair row bank 52X.

By such a configuration as described above, in the example depicted in FIG. 4B, the repair row banks 52X1 formed above the pixel electrode 12a1 in the two gaps 20 between a column bank 14 having the missing portion 3a and column banks 14 on the opposite sides in the X direction of the column bank 14 are structured such that end portions thereof on the opposite sides in the X direction are connected to the column banks 14 adjacent in the X direction. Consequently, the dam 501 that connects the column banks 14 to each other can be constructed.

However, the repair row banks 52X2 formed on the pixel electrode 12a2 are structured such that end portions thereof on the missing portion 3a side in the X direction are not connected in the X direction to adjacent column banks 14, and a dam that connects the column banks 14 to each other cannot be constructed. Therefore, such a configuration is adopted that each of the repair row banks 52X2 is additionally provided with a repair column bank 52Y2 that connects the end portion of the repair row bank 52X2, which is not connected in the X direction to the column bank 14, and a portion of the column bank 14, which is closest to the end portion, to each other in the Y direction. In particular, each of the repair banks 52 formed on the pixel electrode 12a2 have an L-shaped configuration as viewed in plan including the repair row bank 52X2 and the repair column bank 52Y2.

By such a configuration as described above, the repair banks 52 formed above the pixel electrode 12a2 in the two gaps 20 between the column bank 14 having the missing portion 3a and the column banks 14 on the opposite sides in the X direction of the column bank 14 are each structured such that the end portions on the opposite sides thereof are connected to the column banks 14 that are individually adjacent in the X direction.

From the foregoing, as depicted in FIG. 4B, the repair banks 52 formed from the repair row banks 52X1 are formed in the gaps 20 provided on the opposite sides of the column bank 14 having the missing portion 3a to configure the dam 501, and the repair banks 52 formed from the repair row banks 52X2 and the repair column banks 52Y2 are formed in the gaps 20 to configure the dam 502. Further, by the pair of dams 501 and 502, the gaps 20 are partitioned into the first space SA composed of a space portion adjacent to the missing portion 3a and the two second spaces SB composed of space portions that are not adjacent to the missing portion 3a.

Figure 5B:
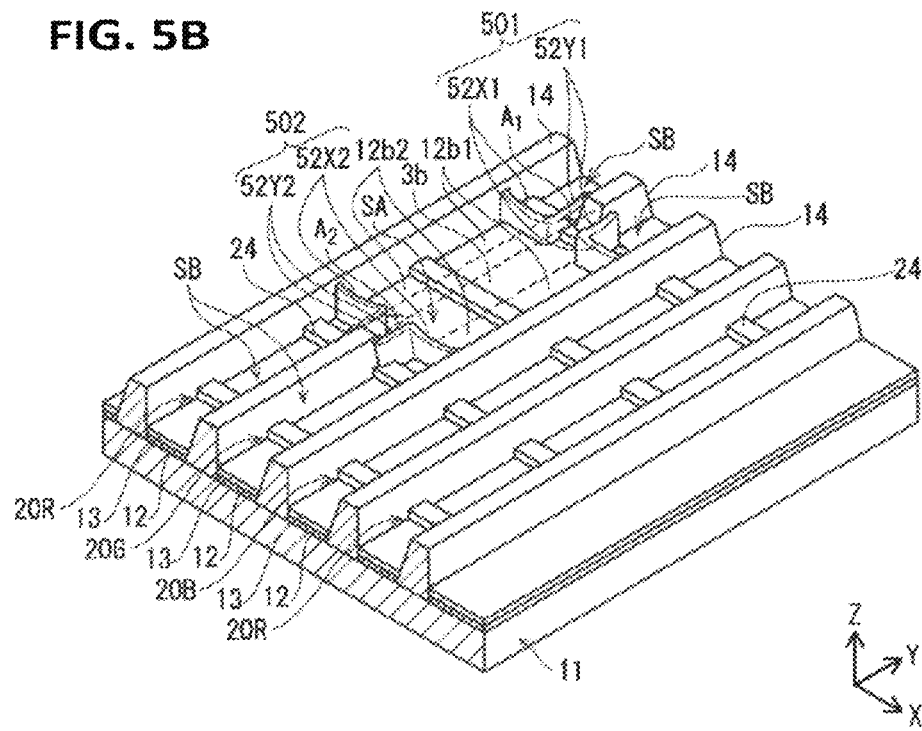

On the other hand, FIG. 5B is a schematic perspective view depicting a state where pairs of repair banks 52X1 and 52Y1 and pairs of repair banks 52X2 and 52Y2 are formed such that they sandwich the missing portion 3b therebetween in the Y direction. As depicted in FIG. 5B, a pair of repair row banks 52X1 and 52X2 (where they are not distinguished from each other, each of them is referred to as a repair row bank 52X) are formed at positions A1 and A2 spaced by a predetermined distance or more in the column direction above pixel electrodes 12b1 and 12b2 (where they are not distinguished from each other, each of them is referred to as a pixel electrode 12b) whose positions in the Y direction are same, at least at part thereof, with that of the missing portion 3b. Here, the positions A1 and A2 may be positions at which the distance in the Y direction is in the maximum, above the pixel electrodes 12b1 and 12b2.

However, in the example depicted in FIG. 5B, the repair row banks 52X1 and 52X2 formed on the pixel electrodes 12b1 and 12b2 are structured such that end portions thereof on the missing portion 3b side in the X direction are not connected in the X direction to the adjacent column bank 14, and a dam that connects the column banks 14 to each other cannot be constructed. Therefore, such a structure is adopted that repair column banks 52Y1 and 52Y2 are additionally provided by which the end portions of the repair row banks 52X1 and 52X2, which are not connected to the column bank 14 in the X direction, and portions of the column bank 14, which are closest to the respective end portions, are connected to each other in the Y direction. In particular, the repair banks 52 formed on the pixel electrode 12b1 are formed from the repair row banks 52X1 and the repair column banks 52Y1 while the repair banks 52 formed on the pixel electrode 12b2 are formed from the repair row banks 52X2 and the repair column banks 52Y2 such that they have an L-shaped configuration as viewed in plan.

By such a configuration as just described, in each of the two gaps 20 between the column bank 14 having the missing portion 3b and the column banks 14 on the opposite sides in the X direction of the column bank 14, the two pairs of repair banks 52 formed above the pixel electrodes 12b1 and 12b2 are structured such that end portions on the opposite sides thereof are individually connected to the column banks 14 adjacent in the X direction.

From the foregoing, as depicted in FIG. 5B, in the gaps 20 on the opposite sides in the X direction of the column bank 14 having the missing portion 3b, the repair banks 52 formed from the repair row banks 52X1 and the repair column banks 52Y1 are formed to configure the dam 501, and the repair banks 52 formed from the repair row banks 52X2 and the repair column banks 52Y2 are formed to configure the dam 502. Further, the pair of dams 501 and 502 partition the gaps 20 into the first space SA configured from a space portion adjacent to the missing portion 3b and the two second spaces SB configured from space portions that are not adjacent to the missing portion 3b.

It is to be noted that a width of each of the repair banks (thickness as viewed in plan) is, for example, 5 to 50 μm.

As described above, in the present embodiment, it is possible, in the gaps 20 on the opposite sides of the column bank 14 in which the missing portion 3 exists, to block the mixture color ink by the pair of dams 501 and 502 to thereby prevent spreading of the mixture color region.

[Organic Light Emitting Layer]

The organic light emitting layer 15 is a portion in which carriers (holes and electrons) recombine to emit light and includes organic materials each corresponding to one of the colors of R, G, and B.

The organic light emitting layers 15 are formed in grooved gaps (refer to the gaps 20R, 20G, and 20B of FIG. 3) defined by the column banks 14 and extending in the Y direction.

It is to be noted that the gap 20R depicted in FIG. 3 is a gap in which a red light emitting layer is formed to form the red light emitting element 10R, and the gap 20G and the gap 20B are gaps in which green and blue light emitting layers are formed to form the green and blue light emitting elements 10G and 10B, respectively.

Accordingly, the organic light emitting layers 15 of colors different from each other are arranged across the column banks 14.

Examples of a material for the organic light emitting layers 15 include fluorescent materials such as polyparaphenylene vinylene (PPV), polyfluorene, oxynoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylene pyran compounds, dicyanomethylene thiopyran compounds, fluorescein compounds, pyrylium compounds, thiopyrylium compounds, selenapyrylium compounds, telluropyrylium compounds, aromatic aldadiene compounds, oligophenylene compounds, thioxanthene compounds, cyanine compounds, acridine compounds, metal complex of 8-hydroxyquinoline compound, metal complex of 2-bipyridine compound, complex of Schiff salt and group III metal, oxin metal complex, and rare earth complex.

In the display panel 100, a pair of repair banks 52 are formed in each of gaps 20 on the opposite sides of a column bank 14 having a missing portion 3 such that the opposite ends of each of the repair banks 52 are connected to the column banks 14 on the opposite sides in the X direction to form dams 501 and 502. Therefore, by the pair of dams 501 and 502 opposing to each other in the Y direction, the gaps 20 are partitioned into a first space SA adjacent to the missing portion 3 and two second spaces SB that are not adjacent to the missing portion 3. Consequently, even if a color mixture region is formed in the first space SA, the color mixture region does not spread to the second spaces SB beyond the repair banks 52.

As a result, a configuration can be implemented in which, in the organic light emitting layers 15 formed in one of the two gaps 20 opposing to each other in the row direction across the missing portion 3, a portion of the organic light emitting layer 15, which is formed in the range sandwiched by the pair of repair row banks 52X1 and 52X2, contains an organic light emitting material that is contained in the organic light emitting layer 15 formed in the other gap 20 opposing in the row direction across the missing portion 3 while portions of the organic light emitting layer 15 formed outside the range sandwiched between the pair of repair row banks 52X1 and 52X2 do not contain the organic light emitting material contained in the organic light emitting layer 15 formed in the other gap 20.

[Electron Transport Layer]

The electron transport layer 16 has a function of transporting electrons injected from the common electrode 17 to the organic light emitting layer 15 and is formed, for example, from oxadiazole derivatives (OXD), triazole derivatives (TAZ), phenanthroline derivatives (BCP, Bphen), or other derivatives.

[Common Electrode]

The common electrode 17 is formed from a light transmissive material having electric conductivity such as ITO or IZO and is provided over all subpixels.

In the present embodiment, the common electrode 17 serves as a cathode.

[Sealing Layer 18]

The sealing layer 18 is provided in order to protect the hole injection layer 13, the organic light emitting layer 15, the electron transport layer 16, and the common electrode 17 against moisture and oxygen.

It is to be noted that, though not depicted, a black matrix or a color filter, for example, may be formed on the sealing layer 18.

<Method for Manufacturing Display Panel>

Figure 6:
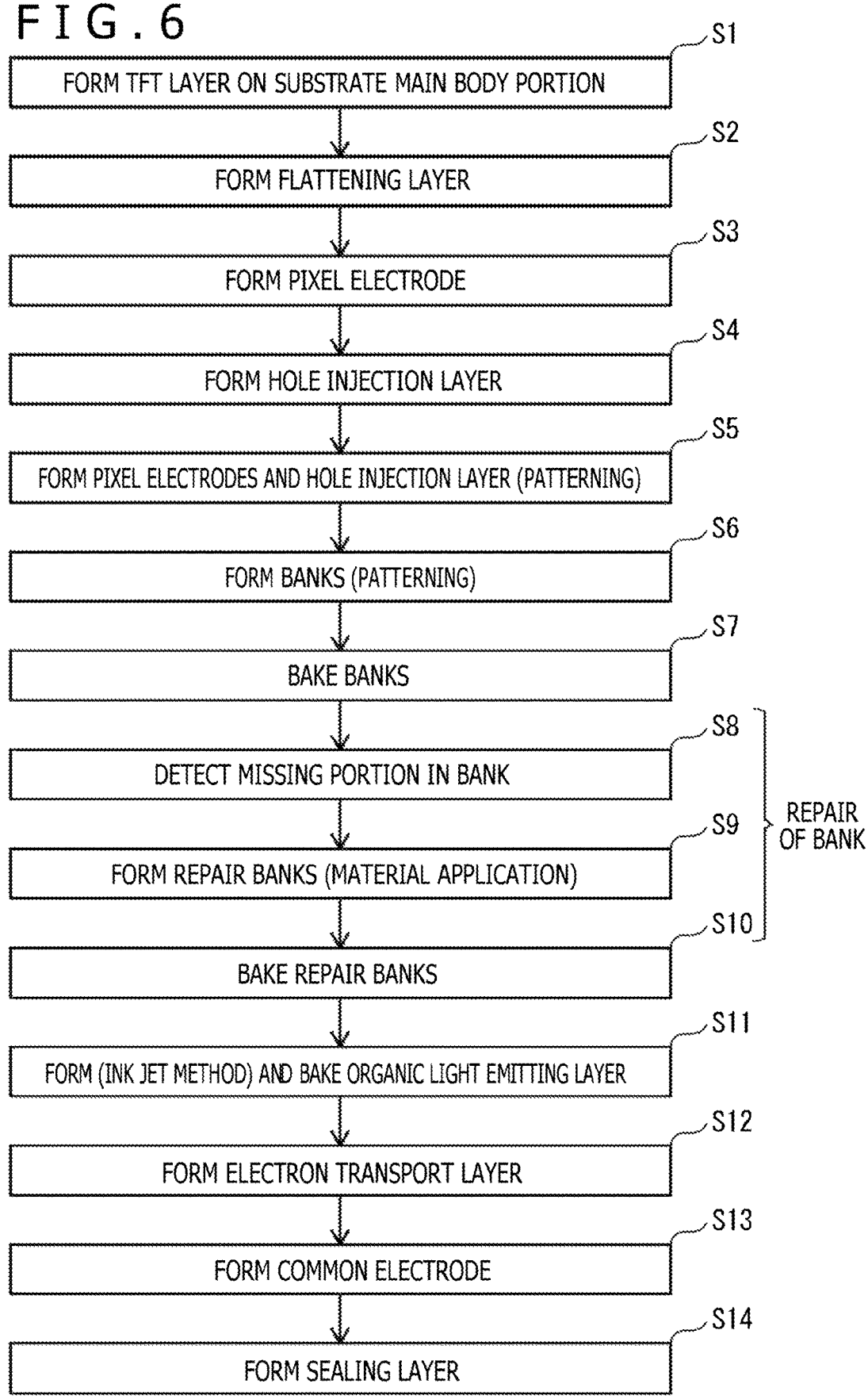
FIG. 6 is a schematic flow chart depicting a manufacturing process of the display panel according to the embodiment.

FIG. 6 is a schematic flow chart depicting a manufacturing process of the display panel 100.

Figure 7A:
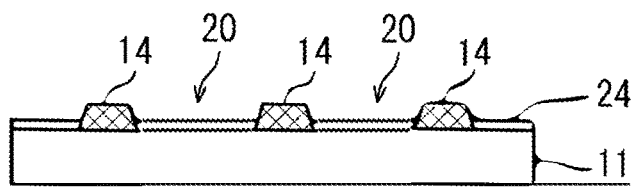
Figure 7B:
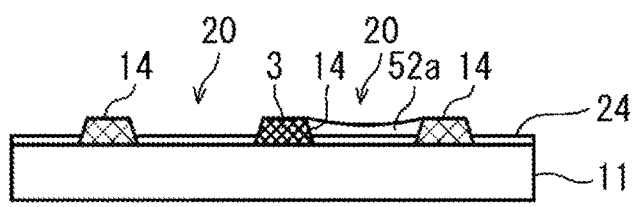

FIGS. 7A and 7B are sectional views schematically depicting part of the manufacturing process of the display panel 100.

The method for manufacturing the display panel 100 is described with reference to FIGS. 3, 5A, and 5B on the basis of the flow chart of FIG. 6.

First, a TFT layer 11b is formed on a substrate main body portion 11a (step S1).

Then, a flattening layer 11c is formed on the TFT layer 11b by a photoresist method using an organic material having superior insulation to produce a base substrate 11 (step S2). The thickness of the flattening layer 11c is, for example, approximately 4 µm. It is to be noted that, though not depicted in the sectional view of FIG. 3 and the flow chart of FIG. 6, when the flattening layer 11c is formed, contact holes 2 (refer to FIG. 2) are formed.

Then, a pixel electrode made of a metal material and having a thickness of approximately 200 [nm] is formed on the base substrate 11 by a vacuum deposition method or a sputtering method (step S3).

Then, a hole injection layer made of tungsten oxide is formed uniformly on the base substrate 11 and the pixel electrode by a sputtering method or another method (step S4).

Then, pixel electrodes 12 and a hole injection layer 13 are formed by patterning for each subpixel by a photolithography method (step S5).

Then, row banks 24 and column banks 14 are formed in the following manner by a photolithography method.

First, a bank material for forming the row banks 24 (for example, a photoresist material having photosensitivity) is applied uniformly on the hole injection layer 13 (step S6).

Thereafter, a photo mask having openings conforming to the pattern of the row banks 24 is overlaid on the applied bank material layer, and ultraviolet (UV) rays are irradiated to perform light exposure. Then, a surplus bank material that is not hardened is removed with a developer to form unbaked row banks 24a. Thereafter, the unbaked row banks 24 are heated and baked to form row banks 24 (step S7).

Then, a bank material for forming column banks 14 (for example, a negative-type photosensitive resin composition) is applied uniformly on the substrate on which the row banks 24 have been formed.

A mask having openings conforming to the pattern of the column banks 14 to be formed is overlaid on the bank material layer, and exposure is performed from above the mask. Thereafter, a surplus bank material is removed with an alkaline developer to pattern the bank material to form the pattern for column banks (step S6). Thereafter, the unbaked column banks 14 are heated and baked to form column banks 14 (step S7). This baking is performed by heating the unbaked column banks 14 for 60 minutes at a temperature of 200° C. to 240° C.

As depicted in FIG. 7A, the row banks 24 and the column banks 14 are formed in pattern. Between adjacent ones of the column banks 14, gaps 20 are formed.

Then, occurrence of a missing portion in the column banks 14 formed in pattern is checked (step S8), and if a missing portion is present, then repair of it is performed.

Although the bank repair is hereinafter described in detail, this is performed by applying a repair material to gaps 20 between the column banks 14 and drying the repair material to form a dam portion in the vicinity of the detected missing portion. In FIG. 7B, a state is depicted in which an unbaked repair bank 52a is formed by applying a repair material to a gap 20 between the column banks 14 (step S9).

Thereafter, the unbaked repair bank 52a is heated and baked to complete the repair bank 52 in addition to the column banks 14 and the row banks 24, thereby completing the repair of the missing portion 3 (step S10). This baking is performed by heating the unbaked repair bank 52a for 60 minutes at a temperature of 200° C. to 240° C.

Figure 7C:
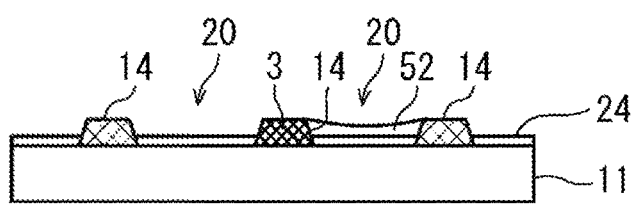

FIG. 7C depicts a state in which the column banks 14 are formed and the repair bank 52 is formed by the baking, namely, a state in which the missing portion 3 on the column bank 14 is repaired.

For the column banks 14 formed in this manner, a process for adjusting a contact angle of the column banks 14 to an ink to be applied at a next step may further be carried out. Alternatively, in order to provide liquid repellency to surfaces of the column banks 14, a surface treatment with a predetermined alkaline solution, water, or an organic solvent, and a plasma process may be carried out, for example. It is to be noted that, in order to provide liquid repellency to the column banks, a material having liquid repellency may be used as the bank material for the column banks.

It is to be noted here that, although the column banks and the dam portions are baked separately from each other, otherwise they may be baked simultaneously. In particular, although processing here is performed in the order of formation of column banks, baking of the column banks, detection of a missing portion, formation of dam portions, and baking of the dam portions, the processing may be performed otherwise in the order of formation of column banks, detection of a missing portion, formation of dam portions, and baking of the column banks and the dam portions.

Figure 7D:
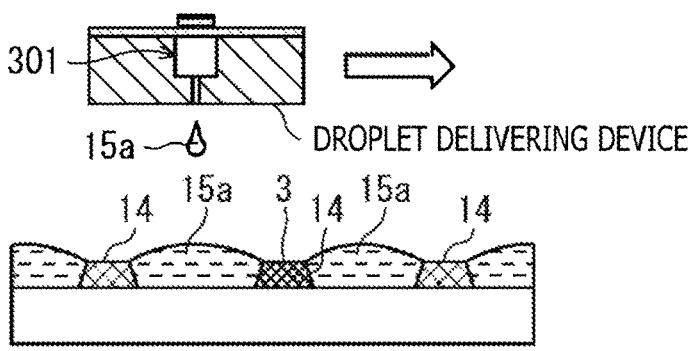

Then, as depicted in FIG. 7D, inks for forming the organic light emitting layers 15 are applied to the gaps 20 between adjacent ones of the column banks 14. The inks are each a mixture of an organic material for configuring the organic light emitting layer 15 and a solvent and is applied to the inside of the gaps 20 by an ink jet method. The method for applying inks to the inside of the gaps 20 by an ink jet method is hereinafter described in detail.

Figure 7E:
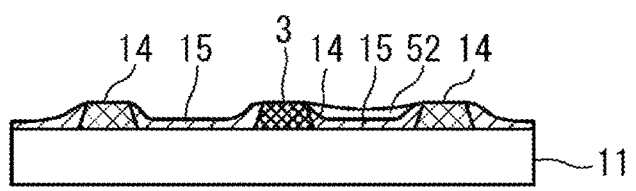

Then, the solvent contained in the applied ink layers 15a is evaporated to be dried, and then heated and baked as occasion demands to form organic light emitting layers 15 in the gaps 20 as depicted in FIG. 7E (step S11).

Then, the solvent contained in the applied ink layers 15a is evaporated to be dried, and then heated and baked as occasion demands to form organic light emitting layers 15 in the gaps 20 as depicted in FIG. 7 (step S11).

Then, on the organic light emitting layer 15 and the column banks 14, a material for configuring the electron transport layer 16 is deposited by a vacuum evaporation method to form an electron transport layer 16 (step S12).

Then, a material such as ITO or IZO is deposited by a sputtering method or another method to form a common electrode (step S13).

Then, on a surface of the common electrode 17, a light transmissive material such as SiN or silicon oxynitride (SiON) is deposited by a sputtering method, a chemical vapor deposition (CVD) method, or another method to form a sealing layer 18 (step S14).

The display panel 100 is completed through the steps described above.

[Method for Applying Inks to Inside of Gaps 20 by Ink Jet Method]

Details of a method for applying inks for the organic light emitting layer 15 to the inside of the gaps 20 using an ink jet method are described.

At the time of formation of the organic light emitting layer 15, inks 15a that are solutions for forming organic light emitting layer 15 are used to form an organic light emitting layer 15R in the gap 20R for a red subpixel, form an organic light emitting layer 15G in the gap 20G for a green subpixel, and form an organic light emitting layer 15B in the gap 20B for a blue subpixel, in each of regions between a plurality of line banks. It is to be noted that the organic light emitting layer 15R and the organic light emitting layer 15G or the organic light emitting layer 15B may be different in thickness from each other. For example, by making the amount of ink to be applied to the inside of the gap 20R greater than the amount of ink to be applied to the inside of the gap 20B and the gap 20G, the thickness of the organic light emitting layer 15R can be formed greater than that of the organic light emitting layer 15B and the organic light emitting layer 15G.

In order to simplify the description, the inks are sequentially applied to gaps for all three colors by a method for applying an ink to a plurality of gaps 20 for the first color on the substrate setting the amount of the ink to be discharged from a nozzle to a first condition, applying an ink to a plurality of gaps 20 for the second color on the substrate setting the amount of the ink to be discharged from the nozzle to a second condition, and then applying an ink to a plurality of gaps 20 for the third color on the substrate setting the amount of the ink to be discharged from the nozzle to a third condition. After the application of an ink to the gaps 20 for the first color on the substrate ends, an ink is applied to the gaps 20 for the second color on the substrate, whereafter an ink is applied to the gaps 20 for the third color on the substrate. Thus, such application steps as just described are performed repeatedly to sequentially apply the inks for the gaps 20 for the three colors. It is to be noted that, as the nozzle for delivering an ink, nozzles different from one another, namely, a nozzle for delivering the ink of the first color, a nozzle for delivering the ink of the second color, and a nozzle for delivering the ink of the third color, may be used.

(Method for Uniformly Applying Ink to Gap 20 Between Column Banks 14)

Figure 8:
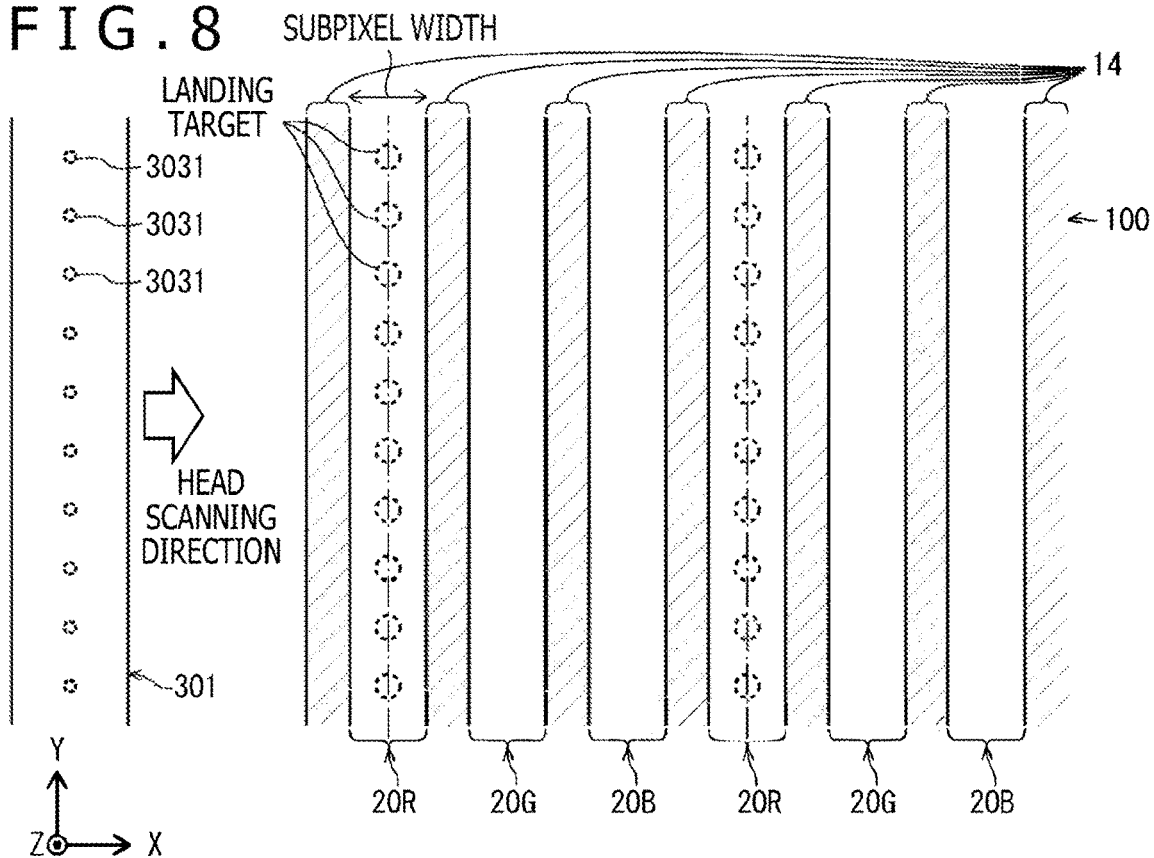
FIG. 8 is a view schematically depicting a method for applying an ink to an inside of a gap by an ink jet method.

Now, a method for applying an ink (for example, an ink for red gaps) to gaps of one color is described. FIG. 8 is a view depicting a step of applying an ink for light emitting layer formation to a substrate and is a schematic view in a case where the ink is applied uniformly to gaps 20 between column banks 14.

The organic light emitting layer 15 extends not only in light emitting regions (regions surrounded by column banks 14 and row banks 24 in FIG. 2) but also to adjacent non-self-luminous regions (regions on row banks 24 in FIG. 2). By this, at the time of formation of the organic light emitting layer 15, the ink applied to the light emitting regions can flow in a column direction through the ink applied to the non-self-luminous regions, and consequently, the film thickness can be leveled between pixels in the column direction. Therefore, large film thickness unevenness is less likely to occur in the column direction, and improvement in terms of luminance unevenness among pixels and lifespan reduction of individual pixels can be anticipated.

In the present application method, the substrate is placed on a work table of a droplet delivering device while it is in a state in which the column banks 14 extend in the Y direction, and while scanning is performed in the X direction with an ink jet head 301 in which a plurality of discharge ports 3031 are arranged on a line along the Y direction, the ink is landed from each discharge port 3031 aiming at a landing target set in a gap 20 between column banks 14.

It is to be noted that the region to which the ink for the organic light emitting layer 15 is applied with a same application amount is one of three regions lined up in an adjacent relation to each other in the X direction.

The method for forming the organic light emitting layer 15 is not limited to this, and inks may be dropped and applied not by such a method as an ink jet method or a gravure printing method but by a known method such as a dispenser method, a nozzle coating method, a spin coating method, intaglio printing, or relief printing.

[Detection of Missing Portion 3 and Formation of Repair Banks 52]

As described in the foregoing description of the manufacturing method, accurately, after unbaked column banks 14a and unbaked repair banks 52a are formed, the unbaked column banks 14a and the unbaked repair banks 52a are heated, baked, and hardened to form final column banks 14 and repair banks 52. However, since the unbaked column banks 14a and the unbaked repair banks 52a are solidified to some degree and have a stable bank shape and dam shape, respectively, in the present specification, also the unbaked column banks 14a and the unbaked repair banks 52a are represented merely as column banks 14a and repair banks 52a, respectively.

Detection of a missing portion 3 in a column bank 14a is performed, for example, by pattern inspection of a photographed surface image of the column banks 14a formed on the base substrate 11.

Figure 9:
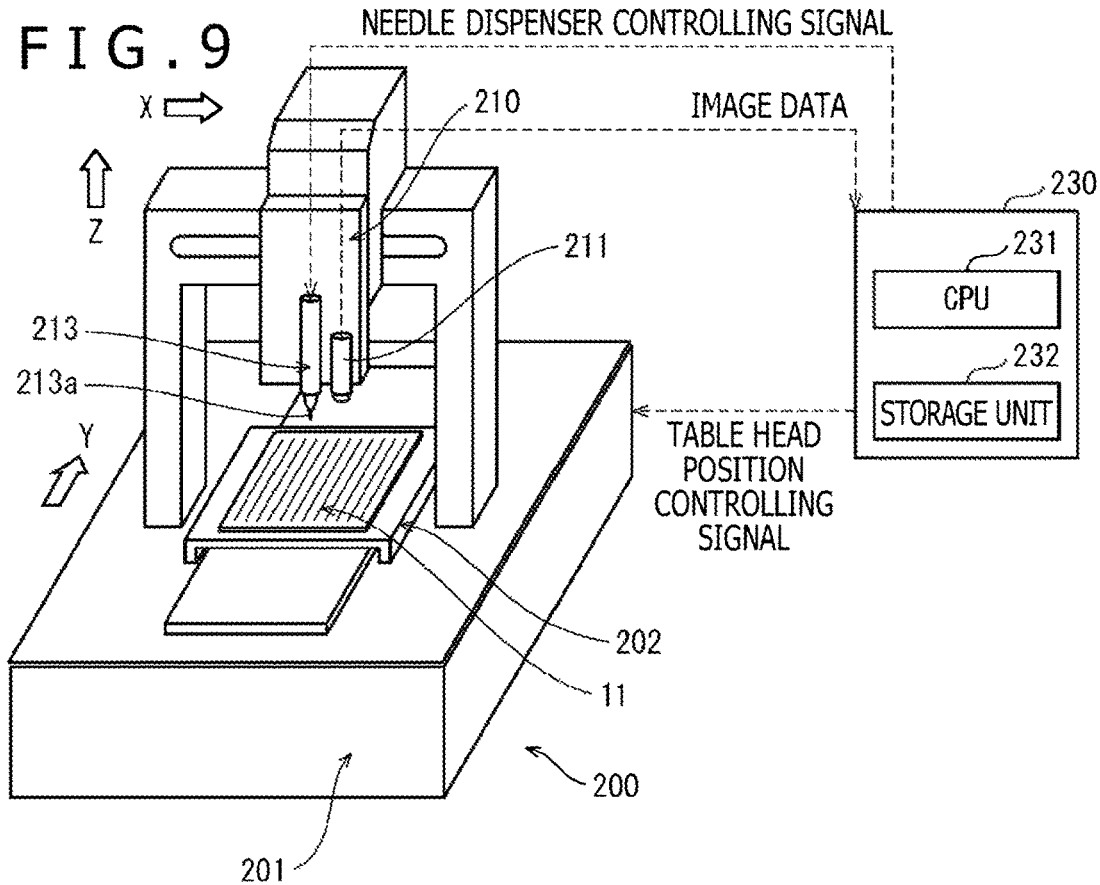
FIG. 9 is a schematic configuration diagram depicting an example of a repair apparatus used for detection of a missing portion and repair of a bank.

FIG. 9 is a schematic configuration diagram depicting an example of a repair apparatus that is used for detection of a bank missing portion and for repair of the bank missing portion.

The repair apparatus 200 includes a table 202 on which the base substrate 11 described hereinabove is to be placed, an imaging element 211, and a head unit 210 to which a needle dispenser 213 is attached, all provided on a base 201. The table 202 can move in the Y direction on the basis of an instruction of a central processing unit (CPU) 231 of a controller 230, and the head unit 210 can move in the X direction and the Z direction in accordance with an instruction of the CPU 231.

Accordingly, the needle dispenser 213 attached to the head unit 210 can move in the X direction, the Y direction, and the Z direction relative to the base substrate 11 placed on the table 202 above the base substrate 11 in accordance with an instruction of the CPU 231.

It is to be noted here that the base substrate 11 on which the pixel electrodes 12, the hole injection layer 13, the column banks 14a, and the row banks 24 are formed is represented as the base substrate 11.

Formation of a repair bank 52 is performed by applying a repair material from the needle dispenser 213 to a plurality of positions set along a line on which the repair bank 52 is to be formed (repair bank formation line) in a gap 20.

(Setting of Repair Bank Formation Line)

Figure 10A:
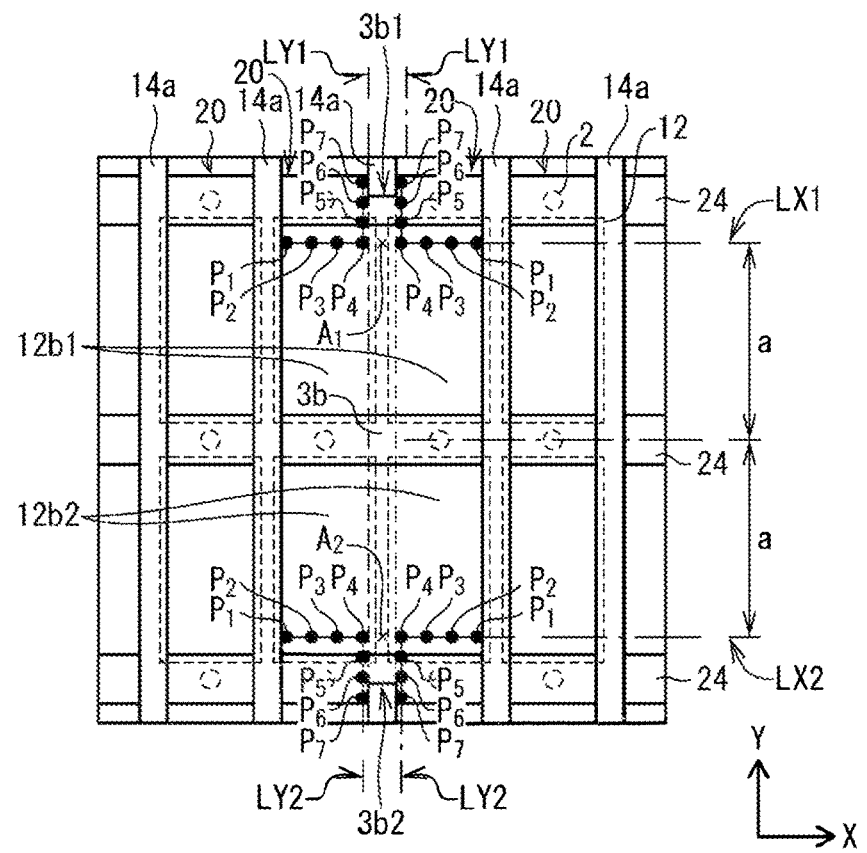
FIG. 10A is a schematic plan view depicting application positions of a repair material by a needle dispenser, set around the missing portion of FIG. 7A.

First, a case is described in which one end 3a1 in the Y direction of the missing portion 3a depicted in FIG. 4A is positioned between row banks 24 adjacent to each other in the Y direction, and the other end 3a2 is positioned on a row bank 24. FIG. 10A is a schematic plan view depicting application positions of the repair material by the needle dispenser, which are set in the vicinity of the missing portion 3a of FIG. 4A.

As depicted in FIG. 10A, in a case where a missing portion 3a exists in a column bank 14a, coordinate positions of the opposite ends 3a1 and 3a2 in the Y direction of the missing portion 3a are acquired, and pixel electrodes 12a1 and 12a2 whose position in the Y direction is same, at least at part thereof, as that of the missing portion 3a are specified on the basis of the acquired coordinate positions. Then, repair row bank formation lines LX1 and LX2 (hereinafter referred to as lines LX1 and LX2) in the X direction are set to positions A1 and A2 that are spaced by a predetermined distance 2×a or more in the column direction above the pixel electrodes 12a1 and 12a2. Points P1 to P4 depicted in FIG. 10 represent application positions by the needle dispenser set along the lines LX1 and LX2. Here, the lines LX1 and LX2 may be set to positions at which the distance in the Y direction between the lines LX1 and LX2 is in the maximum above the pixel electrodes 12a1 and 12a2.

Then, the coordinate positions of the opposite ends 3a1 and 3a2 in the Y direction of the missing portion 3a and the positions in the Y direction of the lines LX1 and LX2 are compared with each other.

In the example of FIG. 10A, the one end 3a1 in the Y direction of the missing portion 3a is positioned between row banks 24 adjacent to each other in the Y direction. Therefore, in the pixel electrodes 12a1, there is a relation that the position in the Y direction of the line LX1 is positioned on the upper side, in the figure, of the coordinate of the end 3a1 in the Y direction of the missing portion 3a. Accordingly, it is determined that the end portions of the repair row banks 52X1 formed on the line LX1 are connected to the column bank 14a.

In contrast, the other end 3a2 of the missing portion 3a is positioned on a row bank 24. Therefore, in the pixel electrodes 12a2, there is a relation that the position in the Y direction of the line LX2 is positioned on the upper side, in the figure, of the coordinate of the other end 3a2 in the Y direction of the missing portion 3a. Accordingly, it is determined that the end portions of the repair row banks 52X2 formed on the line LX2 are not connected to the column bank 14a.

In this case, repair column bank formation lines LY2 (hereinafter referred to as lines LY2) are set in the Y direction from the points P4 closest to the missing portion 3a among the points P1 to P4 to at least the other end 3a2 in the Y direction of the missing portion 3a. Points P5 to P7 depicted in FIG. 10A represent application positions by the needle dispenser set along the lines LY2. At this time, it is necessary for the points P7 to be set to positions on the row bank 24 as viewed in top plan.

Figure 11A:
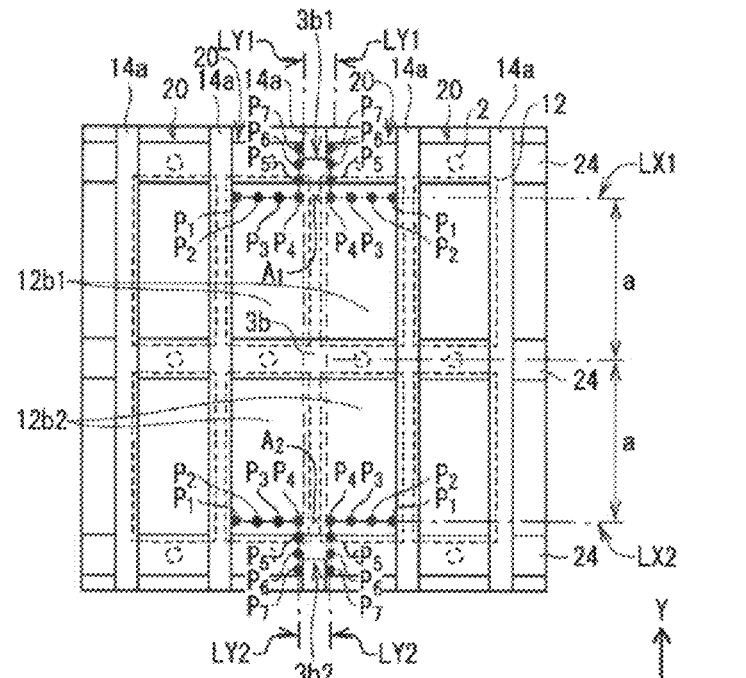
FIG. 11A is a schematic plan view depicting application positions of a repair material by the needle dispenser, set around the missing portion of FIG. 8A.

Now, a case in which both of the opposite ends 3b1 and 3b2 in the Y direction of the missing portion 3b depicted in FIG. 5A are positioned between row banks 24 adjacent to each other in the Y direction is described. FIG. 11A is a schematic plan view depicting application positions of the repair material by the needle dispenser, which are set in the vicinity of the missing portion 3b.

Also in the example depicted in FIG. 11A, pixel electrodes 12b1 and 12b2 whose positions in the Y direction are same, at least at part thereof, as that of the missing portion 3*b* are specified on the basis of coordinate positions of the opposite ends 3*b*1 and 3*b*2 in the Y direction of the missing portion 3*b*. Then, lines LX1 and LX2 in the X direction are set to positions A1 and A2 above the pixel electrodes 12*b*1 and 12*b*2, respectively. Application points P1 to P4 by the needle dispenser are set along the lines LX1 and LX2.

Now, coordinate positions of the opposite ends 3*b*1 and 3*b*2 in the Y direction of the missing portion 3*b* and the positions in the Y direction of the lines LX1 and LX2 are compared with each other.

In the example of FIG. 11A, both of the opposite ends 3*b*1 and 3*b*2 in the Y direction of the missing portion 3*b* are positioned on upper faces of row banks 24 that are adjacent each other in the Y direction. Therefore, the position in the Y direction of the line LX1 is positioned on the lower side, in the figure, of the coordinate of the end 3*b*1 in the Y direction of the missing portion 3*b* and the position in the Y direction of the line LX2 is positioned on the upper side, in the figure, of the coordinate of the end 3*b*2 in the Y direction of the missing portion 3*b*. Accordingly, it is determined that the end portions of the repair row banks 52X1 and 52X2 formed on the lines LX1 and LX2 are not connected to the column bank 14*a* on both of the pixel electrodes 12*b*1 and 12*b*2.

In this case, lines LY1 and LY2 are set in the Y direction from the points P4 that are closest to the missing portion 3*a* among the points P1 to P4 to at least the opposite ends 3*b*1 and 3*b*2 in the Y direction of the missing portion 3*a*. The points P5 to P7 depicted in FIG. 10A represent application positions by the needle dispenser set along the lines LY1 and LY2. At this time, it is necessary for the points P7 to be set to positions on the row banks 24 as viewed in plan.

(Application and Baking of Repair Material)

FIGS. 12A, 12B, 12C, 12D, 12E, 12F, and 12G are views schematically depicting a manner in which a repair bank 52 is formed by sequentially applying the repair material to application points P1, P2, . . . .

The repair apparatus 200 forms a repair bank 52 by sequentially applying the repair material to the application points P1, P2, P3, and P4 or P1, P2, P3, P4, P5, P6, and P7 set in this manner by using a needle 213*a*. The needle dispenser 213 has a tank 213*b*, which accommodates the repair material therein, mounted to a tip end portion thereof and can apply the repair material adhering to the needle 213*a* in a unit of microliter by moving the needle 213*a* upward and downward so as to penetrate the tank 213*b*.

First, as depicted in FIGS. 12A and 12B, the needle 213*a* and the tank 213*b* are positioned above the application point P1, and the needle 213*a* is moved downward to cause the repair material to adhere to the needle 213*a*, whereafter the needle 213*a* is moved toward the application point P1 to apply the repair material to the application point P1.

Although the repair material has fluidity until it is applied, after the application, it is kept in a mountain shape, and a mountain of the repair material is formed at the application point P1 as depicted in FIG. 12C.

Then, the needle 213*a* is pulled up into the tank 213*b* and the needle 213*a* and the tank 213*b* are moved to the application point P2 as depicted in FIG. 12D. Then, as depicted in FIG. 12E, the needle 213*a* is moved downward and is moved, after the repair material adheres thereto, toward the application point P2 to apply the repair material to the application point P2.

By this, a mountain of the repair material formed at the application point P2 connects to the mountain of the repair material formed at the application point P1 as depicted in FIG. 12F.

Thereafter, the needle 213*a* is pulled up and moved to the application point P3 as depicted in FIG. 12G.

Similarly, a mountain of the repair material is formed at the application points P3 and P4 or P3, P4, P5, P6, and P7 so as to connect to the mountain of the repair material at the application point P2.

In this manner, the mountains of the repair material connect to each other in a shape in which they extend from the point A1 on the column bank 14*a* having the missing portion 3 to the adjacent column banks 14*a*. Then, the mountains of the applied repair material are dried and are, as occasion demands, subjected to exposure to form a repair bank 52.

Further, since, at a subsequent simultaneous baking step, the applied repair material is hardened, the repair bank 52 having more stabilized physical properties is formed.

(Formation of Repair Bank 52)

Figure 10B:
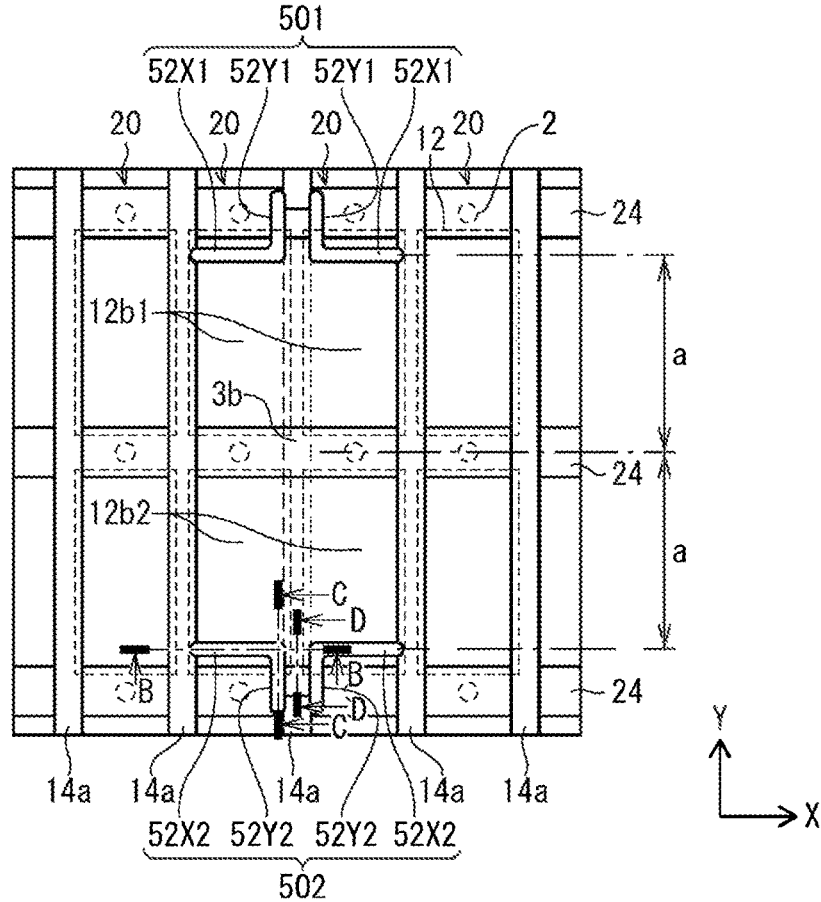
FIG. 10B is a schematic plan view depicting a state in which dam portions are formed.

FIG. 10B is a schematic plan view depicting a state in which repair banks 52 are formed in the vicinity of the missing portion 3*a* of FIG. 4A. As depicted in FIG. 10B, application of the repair material by the needle dispenser 213 and baking using, for example, a laser beam are performed at points P1 to P4, points P1 to P4, and points P5 to P7 respectively along lines LX1, LX2, and LY2 depicted in FIG. 10A in each of the two gaps 20 between the column bank 14 having the missing portion 3*a* and the column banks 14 on the opposite sides in the X direction of the column bank 14.

Consequently, as depicted in FIG. 10B, repair banks 52 each including a repair row bank 52X1 are formed in the gaps 20 on the opposite sides in the X direction of the column bank 14 having the missing portion 3*a* to form a dam 501 connected at opposite end portions thereof to the column banks 14 adjacent in the X direction. Further, repair banks 52 each including a repair row bank 52X2 and a repair column bank 52Y2 are formed in the gaps 20 to form a dam 502 connected at opposite end portions thereof to the column banks 14 adjacent in the X direction.

Further, by the pair of dams 501 and 502 opposing to each other in the Y direction, the gaps 20 are partitioned into a first space SA formed from a space portion adjacent to the missing portion 3*a* and two second spaces SB formed from space portions that are not adjacent to the missing portion 3*a*.

Figure 11B:
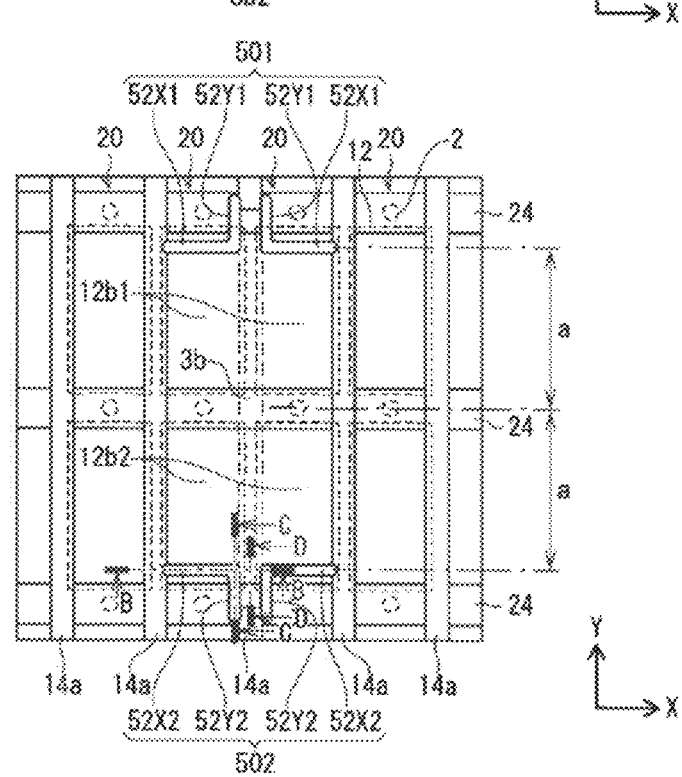
FIG. 11B is a schematic plan view depicting a state in which dam portions are formed.

Further, FIG. 11B is a schematic plan view depicting a state in which repair banks 52 are formed in the vicinity of the missing portion 3*b* of FIG. 5A. In the example depicted in FIG. 11B, in each of the two gaps 20 between the column bank 14 having the missing portion 3*b* and the column banks 14 on the opposite sides in the X direction of the column bank 14, application of the repair material by the needle dispenser 213 and baking using, for example, a laser beam are performed at positions of the points P1 to P4, the points P1 to P4, points P5 to P7, points P5 to P7 respectively along the lines LX1, LX2, LY1, and LY2 depicted in FIG. 11A.

Consequently, as depicted in FIG. 5B, in the gaps 20 on the opposite sides of the column bank 14 having the missing portion 3*b*, repair banks 52 each including a repair row bank 52X1 and a repair column bank 52Y1 are formed to form a dam 501 connected at opposite end portions thereof to the column banks 14 adjacent in the X direction. Further, repair banks 52 each including a repair row bank 52X2 and a repair column bank 52Y2 are formed in the gaps 20 to form a dam 502 connected at opposite end portions thereof to the column banks 14 adjacent in the X direction. Further, by the pair of dams 501 and 502 opposing to each other in the Y direction, the gaps 20 are partitioned into a first space SA formed from a space portion adjacent to the missing portion 3b and two second spaces SB formed from space portions that are not adjacent to the missing portion 3b.

By performing the light emitting layer formation step at the next step S9 (refer to FIG. 6) after the missing portion 3 of any column bank 14 is repaired in such a manner as described above, an ink color mixture region is restricted as hereinafter described, and the ink is applied to the first space SA and the second spaces SB to form the organic light emitting layer 15.

By providing the pair of dams 501 and 502 in the light emitting regions of the pixels on the inner side of the row banks 24 in this manner, normal light emission can be expected outside the pair of dams 501 and 502, and therefore, the area of subpixels whose display quality is deteriorated can be reduced.

It is to be noted that, as the repair material, a composition of a resin that is hardened by application of light or heat can be used.

Examples of the resin include curable resins having an ethylene double bond such as a (meth)acryloyl group, an allyl group, a vinyl group, or a vinyl oxy group.

Further, a crosslinking agent that crosslinks to a resin, for example, an epoxy compound or a polyisocyanate compound, may be added.

Further, in this resin structure, fluorinated polymer with fluorine introduced therein may be used. Since fluorine is introduced in the resin of the repair material, liquid repellency can be provided to the repair banks 52 to be formed. Otherwise, various liquid repellent agents may be added to the resin. The addition amount of the liquid repellent agent is 0.01 to 10 wt %. By adding the liquid repellent agent by an amount within this range, storage stability of the resin composition becomes good and also the liquid repellency of the repair banks 52 to be formed becomes good.

It is to be noted that, as the repair material, a material same as the bank material from which the column banks 14a are formed may be used.

To the resin composition included in the repair material, a solvent and a photopolymerization initiator may be suitably added as occasion demands.

For the solvent, one or more solvents having solubility into resin and having a boiling point of approximately 150° C. to 250° C. may be used.

As the photopolymerization initiator, various commercially available photopolymerization initiators can be used.

At the time of application of the repair material, the solid content of the repair material is adjusted, for example, to 20 to 90 wt %, and the viscosity is adjusted, for example, to 10 to 50 cP (centipoise).

The addition amount of the photopolymerization initiator is adjusted according to the exposure amount upon baking, and it is, for example, 0.1 to 50 wt % to the total solid content, preferably 5 to 30 wt %.

(Advantageous Effects in Manufacture of Repair Banks 52)

Now, details of the method for manufacturing the repair banks 52 are described.

Figure 13C:
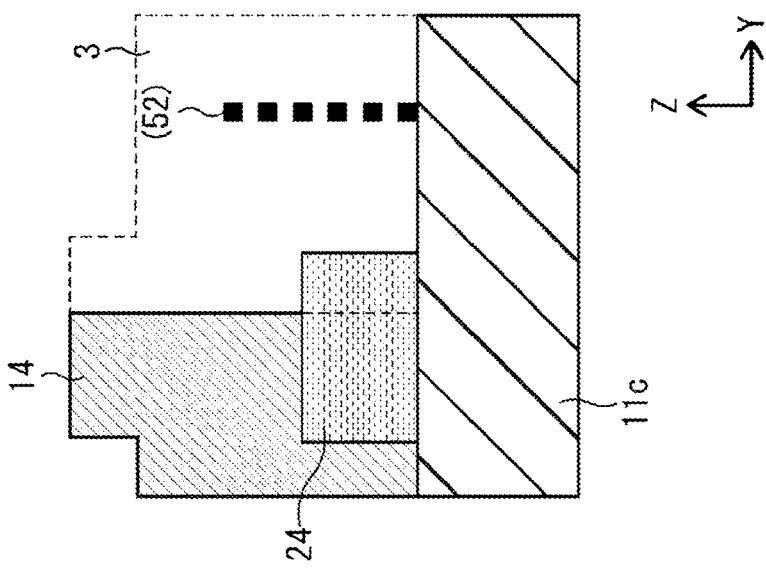
FIGS. 13A, 13B, and 13C are partially enlarged sectional views of the display panel according to the embodiment, taken along line B-B, line C-C, and line D-D of FIG. 11B, respectively.
Figure 13B:
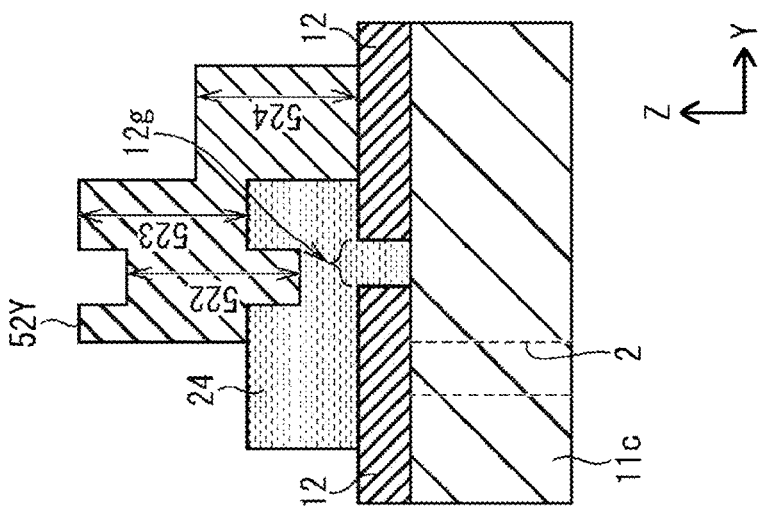
Figure 13A:
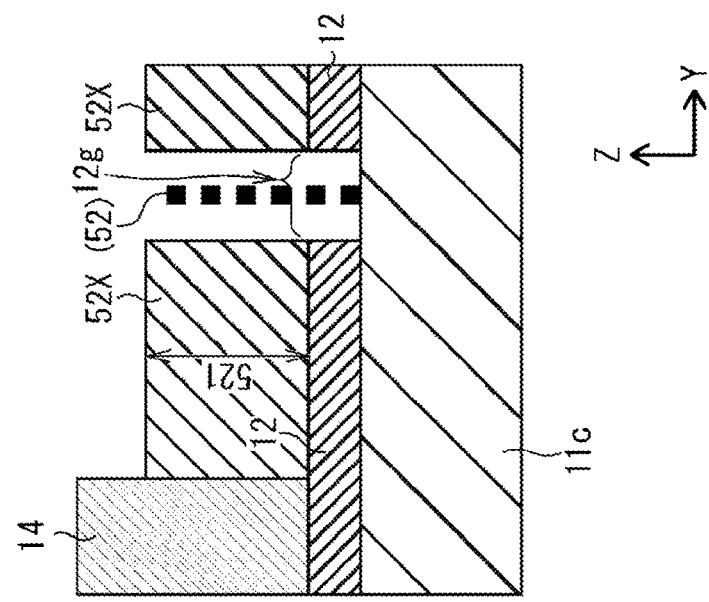

FIGS. 13A, 13B, and 13C are partially enlarged sectional views of the display panel 100 according to the embodiment, taken along line B-B, line C-C, and line D-D of FIG. 11B, respectively.

Referring to FIG. 13A, the thickness of the flattening layer 11c is approximately 4 μm, the height of the column bank 14 is approximately 1 μm, and the thickness of the pixel electrode 12 is approximately 0.2 μm. At the formation step of the organic light emitting layer 15, a height 521 of a dam necessary to prevent flowing out of the ink 15a is approximately 0.7 to 0.8 μm, and it is preferable to form a repair row bank 52X of the height 521 or more above the pixel electrode 12 (in a case where a hole injection layer 13 is stacked, above an upper face of the hole injection layer 13) as depicted in FIG. 13A. In a case where a repair bank (52) is formed on an upper face of the flattening layer 11c between a pixel electrode 12 and another pixel electrode 12, the height of the repair row bank 52X becomes short by an amount of a height corresponding to the thickness of the pixel electrode 12 and the ink 15a sometimes flows out.

Further, in the case where the repair bank (52) is formed on the upper face of the flattening layer 11c between a pixel electrode 12 and another pixel electrode 12, since both of them are made of organic materials, they are high in affinity, and the material of the repair bank (52) is liable to get wet and spread. For example, the material may flow before it is hardened by a laser beam, resulting in failure to form the repair bank (52) with a sufficient height as a dam. In contrast, in the display panel 100, since the repair row bank 52X is formed above the pixel electrode 12, a necessary height can be secured for the repair row bank 52X.

Further, referring to FIG. 13B, the height of the row bank 24 is approximately 0.5 μm. As depicted in FIG. 13A, on an upper face of the row bank 24 positioned above a gap between a pixel electrode 12 and another pixel electrode 12, a recessed portion of a depth corresponding to the thickness of approximately 0.2 μm of the pixel electrode exists. In a case where the repair column bank 52Y is formed across the recessed portion, a recessed portion of an equivalent depth is formed at the same position also on an upper face of the repair column bank 52Y.

When the repair column bank 52Y is formed with a height 524 necessary for a dam, a portion of the repair column bank 52Y formed on the upper face of the row bank 24 is raised by the thickness of approximately 0.5 μm of the row bank 24. Therefore, even if a recessed portion of a depth corresponding to the thickness of approximately 0.2 μm of the pixel electrode in the maximum exists on the upper face of the repair column bank 52Y, the height of the repair column bank 52Y at the recessed portion does not become lower than the height 524 (approximately 0.7 to 0.8 μm) necessary for the dam.

On the other hand, the depth of the contact hole 2 formed in the flattening layer 11c is approximately 4 μm equal to the thickness of the flattening layer 11c. Accordingly, in a case where the repair column bank 52Y is formed on the upper face of the repair column bank 52Y above the contact hole 2, a recessed portion of a depth corresponding to the thickness of approximately 4 μm of the flattening layer 11c is formed on the upper face of the repair column bank 52Y, and therefore, the repair column bank 52Y thus formed cannot secure the height 524 necessary for the dam. Therefore, it is necessary to form the repair column bank 52Y avoiding the position above the contact hole 2. Since, in the display panel 100, the repair column bank 52Y is formed avoiding the position above the contact hole 2, the repair column bank 52Y can secure a height necessary for the dam and can suppress flowing out of ink.

FIG. 13C is a schematic view when it is supposed that a repair column bank (52) is formed so as to compensate for a missing portion of a column bank 14 at a position same as that of the missing portion 3. In this case, since the repair column bank (52) is formed on the upper face of the flattening layer 11c between a pixel electrode 12 and another pixel electrode 12, from a reason similar to that in the example depicted in FIGS. 13A and 13B, the height 524 (approximately 0.7 to 0.8 µm) necessary for the dam cannot be secured.

Figure 14A:
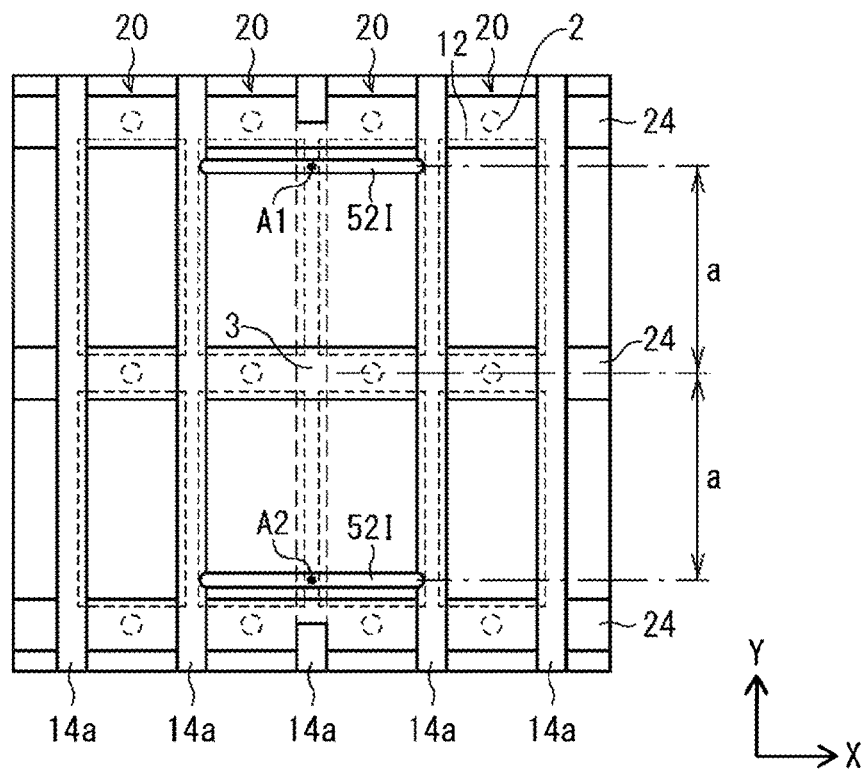
FIGS. 14A and 14B are schematic plan views depicting states of a display panel on which dam portions are formed, which is supposed as a comparative example.
Figure 14B:
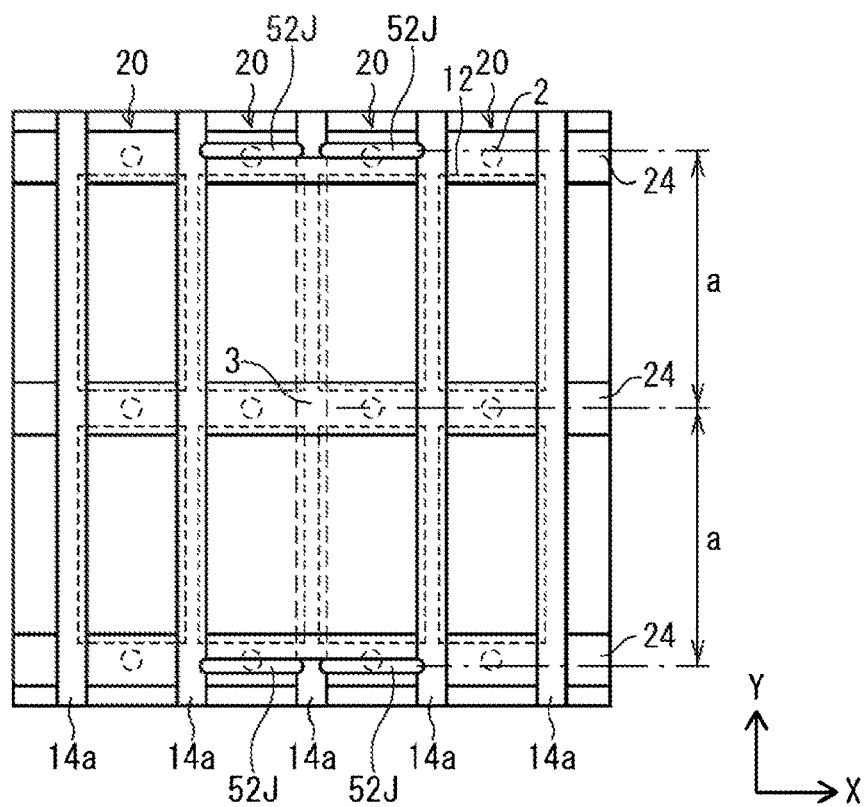

FIGS. 14A and 14B are schematic plan views each depicting a state of a display panel on which dam portions are formed, which is supposed as a comparative example.

First, FIG. 14A is a schematic plan view when it is supposed that, in two gaps 20 between a column bank 14 on which a missing portion 3 exists and column banks 14 adjacent on the opposite sides in the row direction of the column bank 14, a pair of repair row banks 52I are formed at positions A1 and A2 spaced by a predetermined distance 2×a in the column direction such that each of the repair row banks 52I cross the two gaps 20.

In this case, in the vicinity of each of the positions A1 and A2 at which the repair row banks 52I and the missing portion 3 intersect with each other, the repair row bank 52I is formed on the upper face of the flattening layer 11c between a pixel electrode 12 and another pixel electrode 12. Accordingly, as described hereinabove, the height of the repair bank 52I becomes short by an amount of a height corresponding to the thickness of the pixel electrode 12. Further, the material of the repair bank (52) is liable to get wet and spread to the flattening layer 11c and flows before it is hardened. Therefore, the repair row banks 52I cannot sometimes be formed to a height sufficient for the dam.

Further, since the repair banks 52 are made of a repair material having translucency, where the repair banks 52 are formed on the flattening layer 11c similarly having translucency, the visibility when they are viewed in plan is not good, and the workability when the repair material is applied at the bank repair step deteriorates significantly. Therefore, the repair banks 52 are each preferably formed above a region in which the pixel electrode 12 having a light shielding property is formed.

FIG. 14B is a schematic plan view when it is assumed that, in a case where end portions in the Y direction of a missing portion 3 are positioned on upper faces of row banks 24, two repair row banks 52J for connecting the end portion in the Y direction of the missing portion 3 and column banks 14 on the opposite sides in the X direction of the column bank 14 having the missing portion 3 to each other are formed on each of the upper faces of the row banks 24.

In this case, since both the repair row banks 52J and the row banks 24 are made of organic materials, they are high in affinity as described above, and the material of the repair row banks (52) is liable to get wet and spread on the row banks 24. Therefore, the repair row banks 52X cannot sometimes be formed to a height sufficient for the dam.

Further, since contact holes 2 are formed within the range of the row banks 24 as viewed in plan, the repair row banks 52J are formed such that they pass above the contact holes 2. Therefore, a recessed portion of a depth corresponding to the thickness of approximately 4 µm of the flattening layer 11c is formed on the upper face of each of the repair row banks 52J as described hereinabove, and it is difficult to secure a height necessary for the dam.

In contrast, by forming the repair row banks 52X above the pixel electrodes 12 as depicted in FIG. 4B, the height of the repair row banks 52X necessary for the dam can be secured.

The display panel 100 is configured such that part of each of the repair column banks 52Y is formed on the upper face of a row bank 24. However, in the display panel 100, since the repair column banks 52Y are formed avoiding positions above the contact holes 2, there is no decrease of the height arising from the contact holes 2. Further, since the repair column banks 52Y are individually connected, for example, at an end portion thereof in the Y direction, to the repair row banks 52X formed above the column banks 14 and the pixel electrodes 12 as depicted in FIG. 10B and FIG. 11B, even where the affinity of the material with the upper faces of the row banks 24 is high, it can be suppressed that the material of the repair column banks 52Y gets wet and spreads on the row banks 24. Therefore, in the display panel 100, even where the repair column banks 52Y are formed on the upper faces of row banks 24, a height necessary for the dam can be secured, and flowing out of ink can be suppressed.

<Advantageous Effects of Display Panel 100>

Now, spreading of an ink color mixture region is described through comparison between the display panel 100 according to the embodiment and a display panel of a comparative example.

Figure 15:
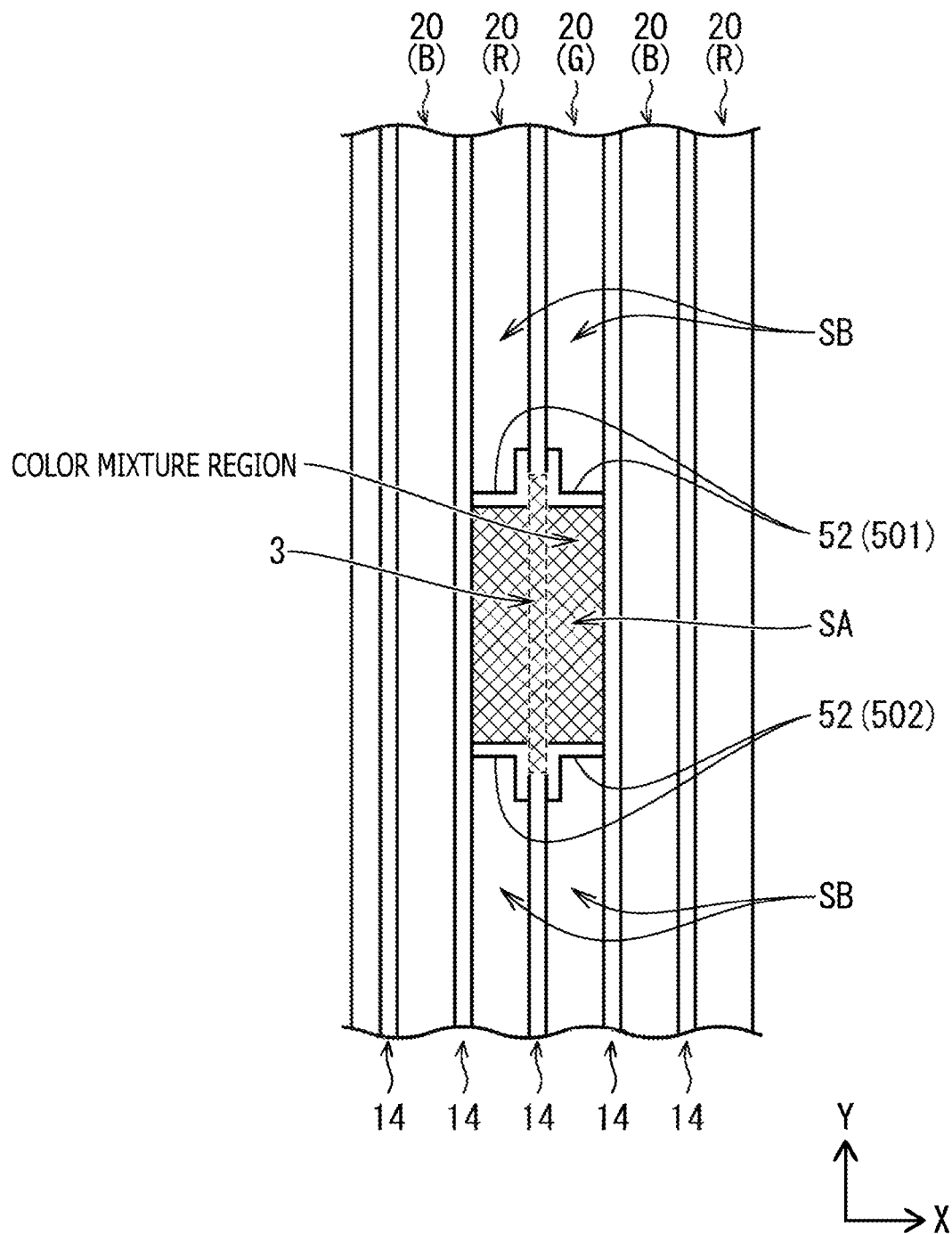
FIG. 15 is a schematic plan view depicting a state in which an ink layer is formed on a display panel 100.

FIG. 15 is a schematic plan view depicting a state in which an ink layer is formed on the display panel 100. FIG. 15 is a plan view depicting a state in which, after pairs of repair banks 52 are formed in the vicinity of a column bank 14 having a missing portion 3 in the display panel 100 according to the present embodiment, an ink layer 15a (R) is formed by applying an ink of an emission color of red to one gap 20 (R) adjacent to the column bank 14 and an ink layer 15a (G) is formed by applying an ink of an emission color of green to the other gap 20 (G). FIG. 16 is a plan view depicting a state in which, in the display panel according to the comparative example depicted in FIG. 14B, an ink layer 15a (R) is formed in a gap 20 (R) and an ink layer 15a (G) is formed in another gap 20 (G) similarly, the gaps being adjacent each other across the column bank 14.

In the comparative example, as depicted in FIG. 16, the repair banks 52 and the column bank 14 are not connected to each other owing to the missing portion 3, and a dam by the repair banks 52 is not formed. Therefore, a color mixture region formed by mixture of a red ink applied to the gap 20 (R) and a green ink applied to the gap 20 (G) through the missing portion 3 flows out passing through gaps between the repair banks 52 and the column bank 14 (FL1, FL2), and in the gap 20 (R) and the gap (G), the red ink and the green ink mix with each other and spread in the Y direction. This color mixture region extends long in the Y direction along the gaps 20, and the length thereof sometimes becomes approximately several centimeters. Then, in the display panel 100 manufactured in this manner, in such a color mixture region, light is emitted in an emission color different from the original emission color. It is to be noted that, where a color filter is installed, since a surplus color is cut, an original emission color is observed. However, the luminance of the light after passing through the color filter sometimes drops. Further, in the color mixture region, the film thickness of the light emitting layer after manufacture sometimes becomes different from a desired one, and a light emission efficiency and a voltage sometimes change from desired ones.

In contrast, in the display panel 100, as depicted in FIG. 15, in the gap 20 (R) to which a red ink is applied, of the gaps 20 on the opposite sides of a column bank 14 having a missing portion 3, a pair of repair banks 52 are formed, and the opposite ends of the repair banks 52 are connected to the column banks 14 on the opposite sides in the X direction to form a pair of dams 501 and 502 opposing to each other in the Y direction. Meanwhile, a pair of repair banks 52 are formed in the gap 20 (G) to which a green ink is applied, and the opposite ends of the repair banks 52 are connected to the column banks 14 on the opposite sides in the X direction to form dams 501 and 502 similarly. By the pair of dams 501 and 502 opposing to each other in the Y direction, the gaps 20 are partitioned into a first space SA formed from a space portion adjacent to the missing portion 3 and two second spaces SB formed from space portions that are not adjacent to the missing portion 3. Therefore, as depicted in FIG. 15, even if a color mixture region is formed in the first space SA, the color mixture region does not spread to the second spaces SB beyond the repair banks 52. In other words, the color mixture region is restricted to a range of subpixels whose position in the Y direction is same, at least at part thereof, as that of the missing portion 3, and deterioration of the display quality or occurrence of a phenomenon caused by color mixture such as emission of light of an emission color different from the original emission color, drop in luminance after passing through a color filter, or change of a light emission efficiency or a voltage from a desired one can be restricted to the range of subpixels that overlap, at least at part thereof, the missing portion 3 in the Y direction.

As described above, with the display panel 100 and the method for manufacturing the display panel 100 according to the embodiment, when part of an elongated bank is missing in a manufacturing process, the range of subpixels whose display quality is deteriorated by such missing in a completed organic EL display panel can be restricted to subpixels including pixel electrodes whose position in the column direction is same, at least at part thereof, as that of the missing portion. Further, in a case where part of a bank is missing and an end portion in the Y direction of the missing portion 3 is positioned on the upper face of a row bank 24, the range of subpixels whose display quality is deteriorated by the missing can be restricted.

<Modifications>

While the display panel 100 according to the embodiment has been described, the present disclosure is not at all restricted to the embodiment described above except essential characteristic components of the same. For example, also modes obtained by applying various modifications conceivable by those skilled in the art to the embodiment and modes implemented by combining the components and the functions in embodiments in a desired manner without departing from the subject matter of the present invention are included in the present disclosure. In the following, as examples of such modes as just described, modifications of the display panel 100 are described.

<Modification 1>

While, in the embodiment described above, the position at which a repair bank 52 is formed is a position above the pixel electrode 12, such a configuration may be adopted that, in addition to the repair column banks 52Y in the display panel 100 according to the embodiment, repair row banks 52 are formed on the upper face of the flattening layer 11c between a pixel electrode 12 and another pixel electrode 12 in the vicinity of the positions A1 and A2 at which the repair row banks 521 and the missing portion 3 intersect with each other as depicted in FIG. 14. Such a disadvantage that the height of the repair row banks 521 formed on the upper face of the flattening layer 11c is insufficient by an amount of a height corresponding to the thickness of the pixel electrodes 12 or that the material of the repair row banks 521 is liable to get wet and spread on the flattening layer 11c and flows before they are hardened is suppressed by the connection to the repair banks 52 formed above the pixel electrodes 12 existing nearby, and the length in the Y direction of the missing portion 3 can be reduced. As a result, in comparison with the repair banks 52 in the display panel 100, the area of the color mixture region in subpixels can be reduced.

<Other Modifications>

While, in the display panel 100 according to the embodiment, three types of pixels are used including red pixels, green pixels, and blue pixels, the present invention is not restricted to this. For example, only one type of a light emitting layer may be used, or four types of light emitting layers for light emission of red, green, blue, and yellow may be used.

Further, while the embodiment described above is configured such that the hole injection layer 13, the organic light emitting layer 15, and the electron transport layer 16 exist between the pixel electrodes 12 and the common electrode 17, the present invention is not limited to this. For example, such a configuration may be used that only the organic light emitting layer 15 exists between the pixel electrodes 12 and the common electrode 17. Also such a configuration that a hole injection layer, a hole transport layer, an electron transport layer, an electron injection layer, and the like are provided in addition to the light emitting layers or a configuration including a plurality of ones of or all of them simultaneously may be adopted. Further, the layers mentioned need not all be configured from organic compounds but may be configured from inorganic materials.

While, in the description of the embodiment and modifications, bank repair methods and bank forms are described taking an organic EL panel of the top emission type as an example, the bank repair methods and the bank forms can be applied also to an organic EL panel of the bottom emission type.

While, in the description of the embodiment and the modifications, bank repair methods and bank forms are described taking an organic EL display panel as an example, the display panel is not limited to an organic EL display panel as long as it is of the type in which a self-luminous layer is formed by a wet method in a line bank structure. For example, the present disclosure can be applied also to a case in which the display panel is formed by a wet method in a line bank structure using a solvent in which electroluminescence quantum dot is dispersed, and similar advantageous effects are achieved.

<<Supplement>>

Any of the embodiments described above indicates a preferred particular example of the present invention. Numerical values, shapes, materials, components, locations, and connection forms of the components, steps, orders of the steps, and so forth indicated by the embodiments are exemplary and are not intended to limit the present invention. Further, steps that are included in the embodiments but not described in independent claims that indicate top concepts of the present invention are described as optional components that constitute more preferable modes.

Further, the order in which the steps are executed is exemplary for particular description of the present invention, and an order different from the described order may be applicable. Further, part of the steps may be executed simultaneously with (in parallel to) a different step.

Further, in order to facilitate understandings of the invention, the scale of components in the figures to which the embodiments refer is sometimes different from an actual one. Further, the present invention shall not be restricted by the foregoing description of the embodiments and can be altered suitably without departing from the subject matter of the present invention.

Further, at least part of the functions of the embodiments and the modifications may be combined.

Furthermore, also various modifications in which a change within a range conceived by those skilled in the art is applied to the present embodiments are included in the present invention.

INDUSTRIAL APPLICABILITY

The present disclosure can be utilized, for example, in organic EL display panels and organic EL display apparatuses that are used as various display apparatuses for home use, for use in public facilities, or for business use, television apparatuses, displays for portable electronic equipment, and so forth.

REFERENCE SIGNS LIST

1: Organic EL display apparatus
3: Missing portion
10: Organic EL element
11: Base substrate
14, 14a: Column bank
15: Organic light emitting layer
20: Gap
24, 24a: Row bank
52: Repair bank
52X: Repair row bank
52Y: Repair column bank
501, 502: Dam
100: Display panel
200: Repair apparatus
213: Needle dispenser

The invention claimed is:

1. A method for manufacturing an organic electro luminescence display panel, comprising:
   a step of preparing a substrate;
   a step of arranging a plurality of pixel electrodes in a matrix on an upper face of the substrate;
   a step of forming, between the plurality of pixel electrodes adjacent to each other at least in a row direction on the substrate, a plurality of elongated column banks extending in a column direction and formed in parallel to each other;
   a step of detecting a missing portion at which part of a column bank of the plurality of elongated column banks does not exist;
   a step of forming, above the plurality of pixel electrodes, a pair of repair banks in each of two gaps between the column bank of the plurality of elongated column banks in which the missing portion has been detected and column banks adjacent on opposite sides in the row direction of the column bank, wherein
      the pair of repair banks are not connected with the column bank,
      the pair of repair banks are connected with row banks of a plurality of elongated row banks,
      each repair bank of the pair of repair banks is L-shaped, and
      a first side of the L-shaped repair bank is parallel to the plurality of elongated column banks and a second side of the L-shaped repair bank is parallel to the plurality of elongated row banks;
   a step of forming a light emitting layer by applying a first ink that contains an organic light emitting material to each of the gaps between the plurality of elongated column banks; and
   a step of forming a common electrode above the light emitting layer, wherein
      the step of forming the pair of repair banks includes
      a first step of forming the pair of repair row banks at positions spaced by at least a predetermined distance in the column direction above the plurality of pixel electrodes that exist in the two gaps and whose positions in the column direction are same, at least at part thereof, as that of the missing portion, and
      a second step of forming repair column banks that connect, in the column direction, an end portion of each of the pair of repair row banks that are not connected in the row direction to the column bank that has the missing portion to a closest portion of the column bank.

2. The method for manufacturing the organic electro luminescence display panel according to claim 1, wherein, at the first step, the pair of repair row banks are formed at positions at which the predetermined distance in the column direction is maximum.

3. The method for manufacturing the organic electro luminescence display panel according to claim 1, wherein, at the step of forming the light emitting layer, of the first ink applied into a first gap of the two gaps, a second ink applied to a range sandwiched by the pair of repair row banks flows out through the missing portion into a second gap of the two gaps opposing in the row direction across the missing portion but is blocked within the range in the column direction by the pair of repair row banks.

4. The method for manufacturing the organic electro luminescence display panel according to claim 1, further comprising:
   a step of forming, between the plurality of pixel electrodes that are adjacent to each other at least in the column direction on the substrate, the plurality of elongated row banks extending in the row direction and formed in parallel to each other, wherein
   opposite ends of the missing portion in the column bank that has the missing portion are each positioned on an upper face of one row bank of the plurality of elongated row banks.

5. The method for manufacturing the organic electro luminescence display panel according to claim 4, further comprising:
   a step of forming, at portions of the plurality of pixel electrodes positioned below the plurality of elongated row banks, a contact hole at which part of a surface of at least one pixel electrode of the plurality of pixel electrodes is recessed, wherein
   the repair column banks are formed at positions at which the repair column banks do not overlap the contact holes as viewed in plan.

6. An organic electro luminescence display panel, comprising:
   a substrate;
   a plurality of pixel electrodes arranged in a matrix on an upper face of the substrate;
   a plurality of elongated column banks that extends in a column direction and are formed in parallel to each other between the plurality of pixel electrodes adjacent to each other at least in a row direction on the substrate;
   a missing portion at which part of a column bank of the plurality of elongated column banks does not exist;
   a pair of repair banks formed, above the plurality of pixel electrodes, in each of two gaps between the column bank of the plurality of elongated column banks that has the missing portion and column banks adjacent on opposite sides in the row direction of the column bank, wherein
the pair of repair banks are not connected with the column bank,
the pair of repair banks are connected with row banks of a plurality of elongated row banks,
each repair bank of the pair of repair banks is L-shaped, and
a first side of the L-shaped repair bank is parallel to the plurality of elongated column banks and a second side of the L-shaped repair bank is parallel to the plurality of elongated row banks;
a light emitting layer composed of an application film formed in each of the gaps between the plurality of elongated column banks; and
a common electrode provided above the light emitting layer, wherein
the repair banks include
a pair of repair row banks formed at positions spaced by at least a predetermined distance in the column direction above the plurality of pixel electrodes that exist in the two gaps and whose positions in the column direction are same, at least at part thereof, as that of the missing portion, and
repair column banks that connect, in the column direction, an end portion of each of the pair of repair row banks that are not connected in the row direction to the column bank that has the missing portion to a closest portion of the column bank.

7. The organic electro luminescence display panel according to claim 6, wherein
the pair of repair row banks are formed at positions at which the predetermined distance in the column direction is maximum.

8. The organic electro luminescence display panel according to claim 6, wherein,
of the light emitting layer formed in a first gap of the two gaps,
a portion that is formed in a range sandwiched by the pair of repair row banks contains an organic light emitting material that is contained in the light emitting layer formed in a second gap of the two gaps which opposes the row direction across the missing portion, and
a portion that is formed outside the range sandwiched by the pair of repair row banks does not contain the organic light emitting material that is contained in the light emitting layer formed in the second gap.

9. The organic electro luminescence display panel according to claim 6, further comprising:
a plurality of elongated row banks that extends in the row direction and are formed in parallel to each other between the plurality of pixel electrodes adjacent to each other at least in the column direction on the substrate, wherein
opposite ends of the missing portion in the column bank that has the missing portion are each positioned on an upper face of one row bank of the plurality of elongated row banks.

10. The organic electro luminescence display panel according to claim 9, wherein
at portions of the plurality of pixel electrodes positioned below the plurality of elongated row banks, a contact hole at which part of a surface of at least one pixel electrode of the plurality of pixel electrodes is recessed is provided, and
the repair column banks are formed at positions at which the repair column banks do not overlap the contact holes as viewed in plan.

\* \* \* \* \*